(12) United States Patent
Lim

(10) Patent No.: US 12,178,043 B2
(45) Date of Patent: Dec. 24, 2024

(54) NONVOLATILE MEMORY DEVICE

(71) Applicant: Samsung Electronics Co., Ltd., Suwon-si (KR)

(72) Inventor: Geunwon Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 718 days.

(21) Appl. No.: 17/232,500

(22) Filed: Apr. 16, 2021

(65) Prior Publication Data

US 2022/0109004 A1 Apr. 7, 2022

(30) Foreign Application Priority Data

Oct. 6, 2020 (KR) .......................... 10-2020-0128953

(51) Int. Cl.
| | | |
|---|---|---|
| G11C 8/14 | (2006.01) |
| H10B 41/10 | (2023.01) |
| H10B 41/27 | (2023.01) |
| H10B 41/35 | (2023.01) |
| H10B 43/10 | (2023.01) |
| H10B 43/27 | (2023.01) |
| H10B 43/35 | (2023.01) |

(52) U.S. Cl.
CPC .............. *H10B 43/27* (2023.02); *G11C 8/14* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
None
See application file for complete search history.

(56) References Cited

U.S. PATENT DOCUMENTS

| | | | |
|---|---|---|---|
| 7,029,949 B2 | 4/2006 | Farnworth et al. | |
| 9,564,451 B1 | 2/2017 | Shin et al. | |
| 9,831,266 B2 | 11/2017 | Kai et al. | |
| 10,381,369 B2 | 8/2019 | Kim et al. | |
| 10,700,079 B2 | 6/2020 | Park et al. | |
| 2010/0109065 A1* | 5/2010 | Oh ...................... | H01L 27/0688 257/314 |
| 2013/0313629 A1* | 11/2013 | Shim ..................... | H10B 43/27 257/324 |
| 2017/0125436 A1* | 5/2017 | Sharangpani ....... | H01L 21/0228 |

(Continued)

FOREIGN PATENT DOCUMENTS

| | | |
|---|---|---|
| JP | 2019-161094 A | 9/2019 |
| KR | 10-2019-0056717 A | 5/2019 |

*Primary Examiner* — Shaun M Campbell
*Assistant Examiner* — Carnell Hunter, III
(74) *Attorney, Agent, or Firm* — HARNESS, DICKEY & PIERCE, P.L.C.

(57) ABSTRACT

A nonvolatile memory device may include a substrate; a first stacked structure on the substrate; a second stacked structure on the first stacked structure; a channel structure including a first portion passing through the first stacked structure and a second portion passing through the second stacked structure; and a filling structure including a first portion passing through the first stacked structure and extending in a first horizontal direction and a second portion passing through the second stacked structure and extending in the first horizontal direction. The upper end of the first portion of the filling structure may be at a same height as the upper end of the first portion of the channel structure.

18 Claims, 24 Drawing Sheets

(56) References Cited

U.S. PATENT DOCUMENTS

| | | | |
|---|---|---|---|
| 2017/0352552 A1* | 12/2017 | Lee | H01L 21/4846 |
| 2018/0182771 A1* | 6/2018 | Costa | H10B 43/27 |
| 2019/0287990 A1 | 9/2019 | Sugisaki | |
| 2019/0333929 A1* | 10/2019 | Lee | H10B 41/20 |
| 2020/0035699 A1 | 1/2020 | Liu et al. | |

* cited by examiner

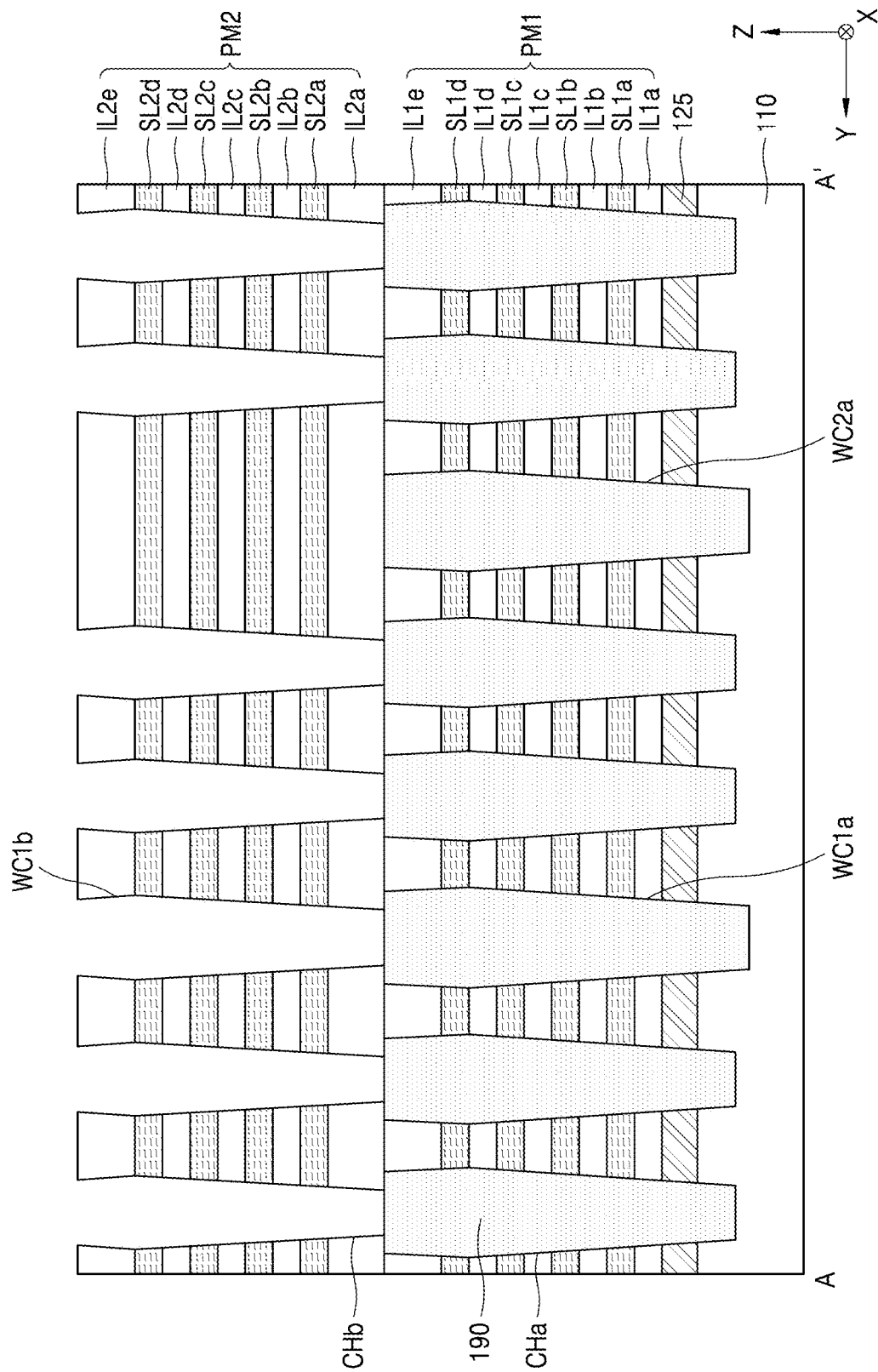

NONVOLATILE MEMORY DEVICE

CROSS-REFERENCE TO RELATED APPLICATION

This application is based on and claims priority under 35 U.S.C. § 119 to Korean Patent Application No. 10-2020-0128953, filed on Oct. 6, 2020 in the Korean Intellectual Property Office, the disclosure of which is incorporated by reference herein in its entirety.

BACKGROUND

Inventive concepts relate to a nonvolatile memory device, and more particularly, to a three-dimensional (3D) nonvolatile memory device.

As memory devices with improved performance and lower cost may be required, higher integration of memory devices may be required. In order to implement a nonvolatile memory device having a higher degree of integration, a 3D memory device including a plurality of gate layers stacked on a substrate and a channel passing through the plurality of gate layers has been proposed. Because the degree of integration of the 3D memory device may be improved by increasing the number of gate layers to be stacked, the 3D memory device may be advantageous in improving the degree of integration.

SUMMARY

Inventive concepts provide a nonvolatile memory device having a simplified process and/or reduced cost.

According to an embodiment of inventive concepts, a nonvolatile memory device may include a substrate; a first stacked structure including a plurality of first gate layers and a plurality of first interlayer insulating layers alternately stacked on the substrate; a second stacked structure including a plurality of second gate layers and a plurality of second interlayer insulating layers alternately stacked on the first stacked structure; a channel structure including a first portion passing through the first stacked structure and a second portion passing through the second stacked structure; and a filling structure including a first portion passing through the first stacked structure and extending in a first horizontal direction and a second portion passing through the second stacked structure and extending in the first horizontal direction. A diameter of an upper end of the first portion of the channel structure may be greater than a diameter of a lower end of the second portion of the channel structure. A width of an upper end of the first portion of the filling structure in a second horizontal direction may be greater than a width in the second horizontal direction of the lower end of the second portion of the filling structure. The upper end of the first portion of the filling structure may be at a same height as the upper end of the first portion of the channel structure.

According to an embodiment of inventive concepts, a nonvolatile memory device may include a substrate; a first stacked structure including a plurality of first gate layers and a plurality of first interlayer insulating layers alternately stacked on the substrate; a second stacked structure including a plurality of second gate layers and a plurality of second interlayer insulating layers alternately stacked on the first stacked structure; a channel structure including a first portion passing through the first stacked structure and a second portion passing through the second stacked structure; and a filling structure passing through at least a portion of the first stacked structure and the second stacked structure. The filling structure may extend in a first horizontal direction. The filling structure may include a first portion, a second portion, and a third portion. The first portion of the filling structure may pass through the first stacked structure and extend in the first horizontal direction. The second portion of the filling structure may be on the first portion of the filling structure, pass through the second stacked structure, and extend in the first horizontal direction. The third portion of the filling structure may be on the first portion of the filling structure, pass through the second stacked structure, and extend in the first horizontal direction. The third portion of the filling structure may be spaced apart from the second portion of the filling structure in the first horizontal direction. An upper end of the first portion of the filling structure may be at a same height as an upper end of the first portion of the channel structure.

According to an embodiment of inventive concepts, a nonvolatile memory device may include a substrate; a first stacked structure including a plurality of first gate layers and a plurality of first interlayer insulating layers alternately stacked on the substrate; a second stacked structure including a plurality of second gate layers and a plurality of second interlayer insulating layers alternately stacked on the first stacked structure; a channel structure; and a first filling structure. The first stacked structure may define a first channel hole and a first word line cut passing through the first stacked structure. The first word line cut may extend in a first horizontal direction. The second stacked structure may define a second channel hole and a second word line cut passing through the second stacked structure. The second word line cut may extend in the first horizontal direction. The channel structure may be in the first channel hole and the second channel hole. The channel structure may pass through the first stacked structure and the second stacked structure. The channel structure may extend partially into the substrate. The first filling structure may be in the first word line cut and the second word line cut. The first filling structure may pass through the first stacked structure and the second stacked structure. The first filling structure may extend partially into the substrate. A height of a lower end of the first word line cut may be lower than a height of a lower end of the first channel hole. An upper end of the first word line cut may be at a same height as an upper end of the first channel hole.

BRIEF DESCRIPTION OF THE DRAWINGS

Embodiments of inventive concepts will be more clearly understood from the following detailed description taken in conjunction with the accompanying drawings in which:

FIGS. 10A to 10G and 10I to 10K are cross-sectional views illustrating a method of manufacturing a nonvolatile memory device, according to embodiments;

DETAILED DESCRIPTION

Figure 1:
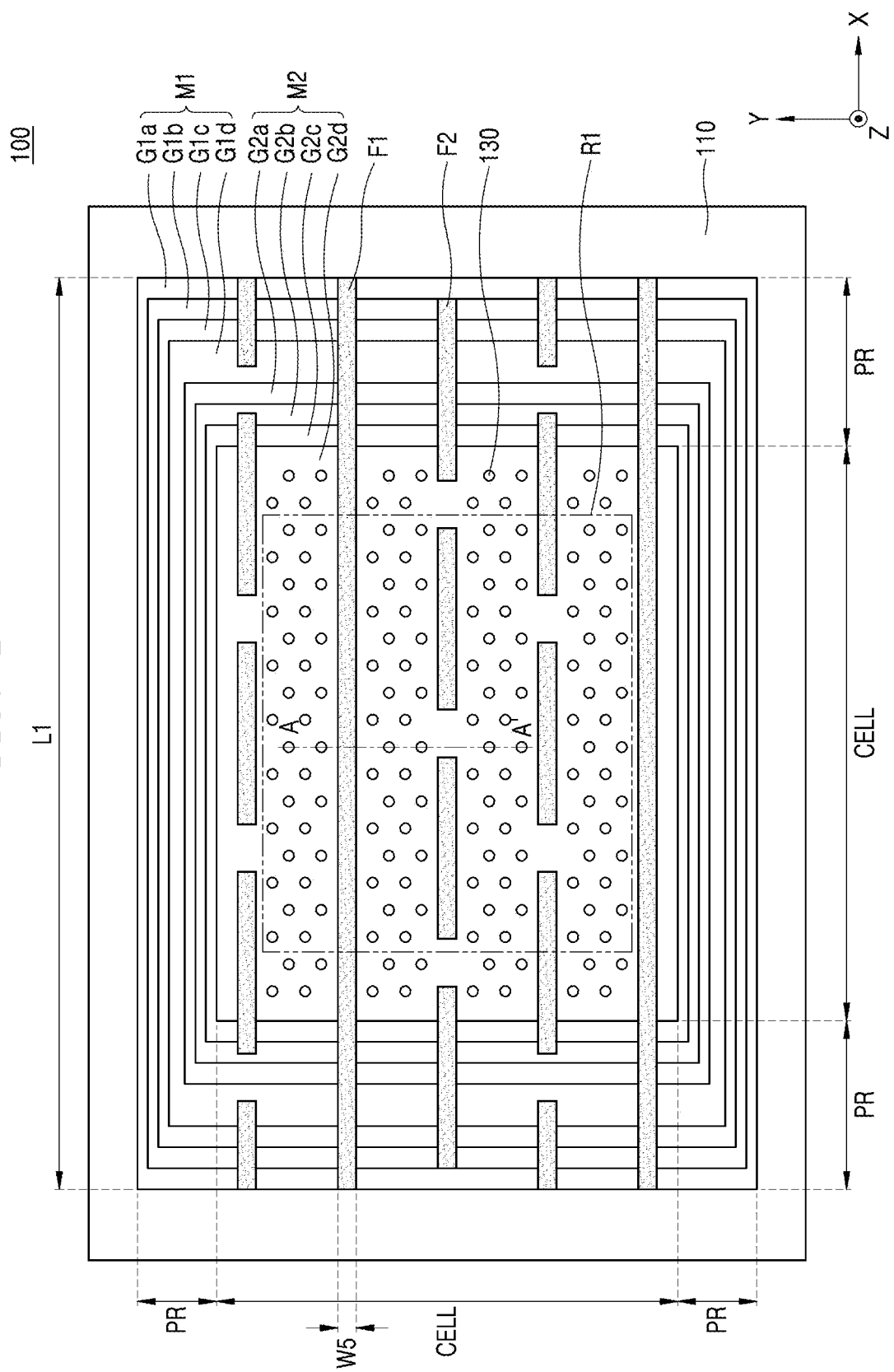
FIG. 1 is a plan view of a nonvolatile memory device according to embodiments.
Figure 2:
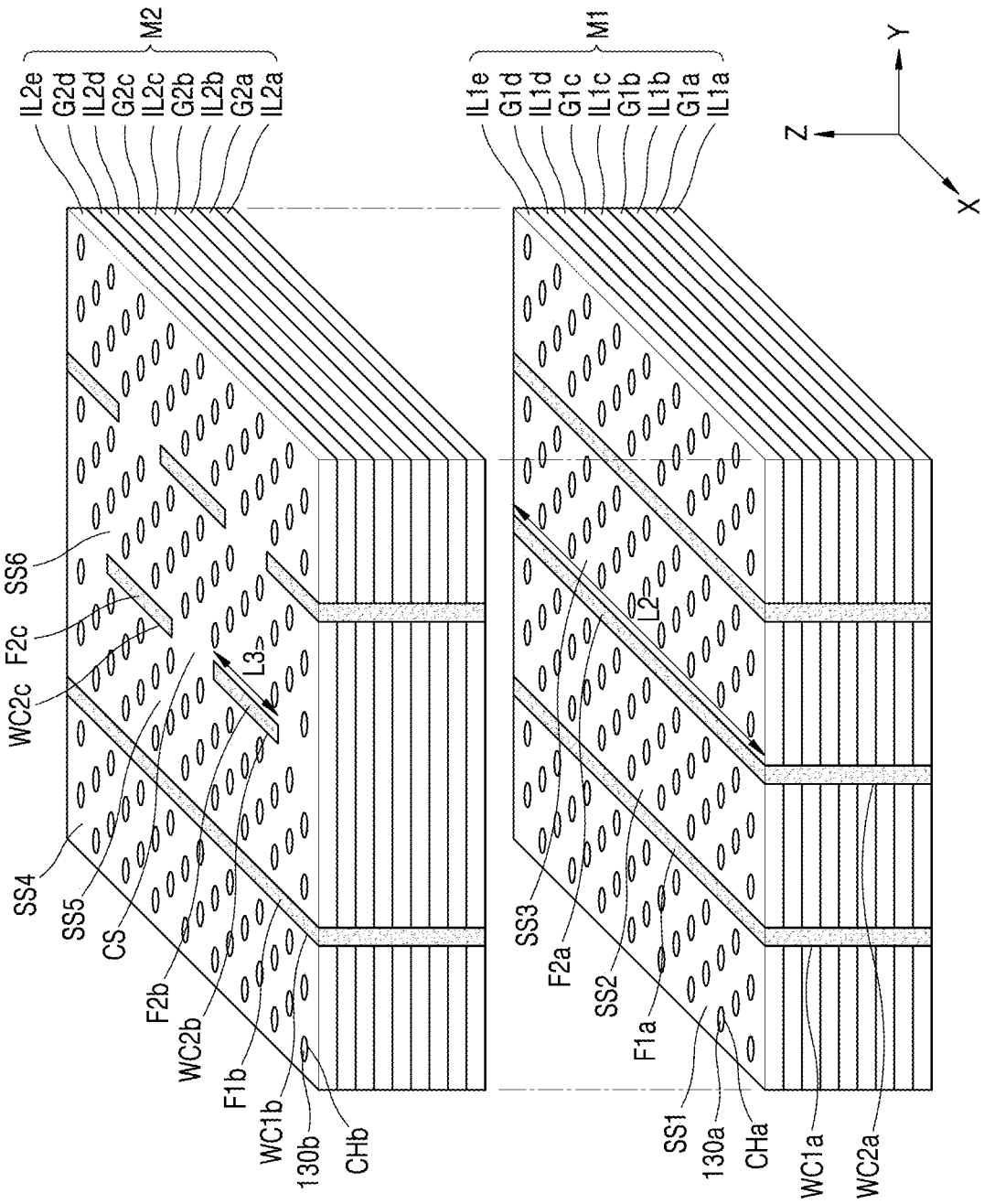
FIG. 2 is a perspective view of area R1 of FIG. 1.
Figure 3:
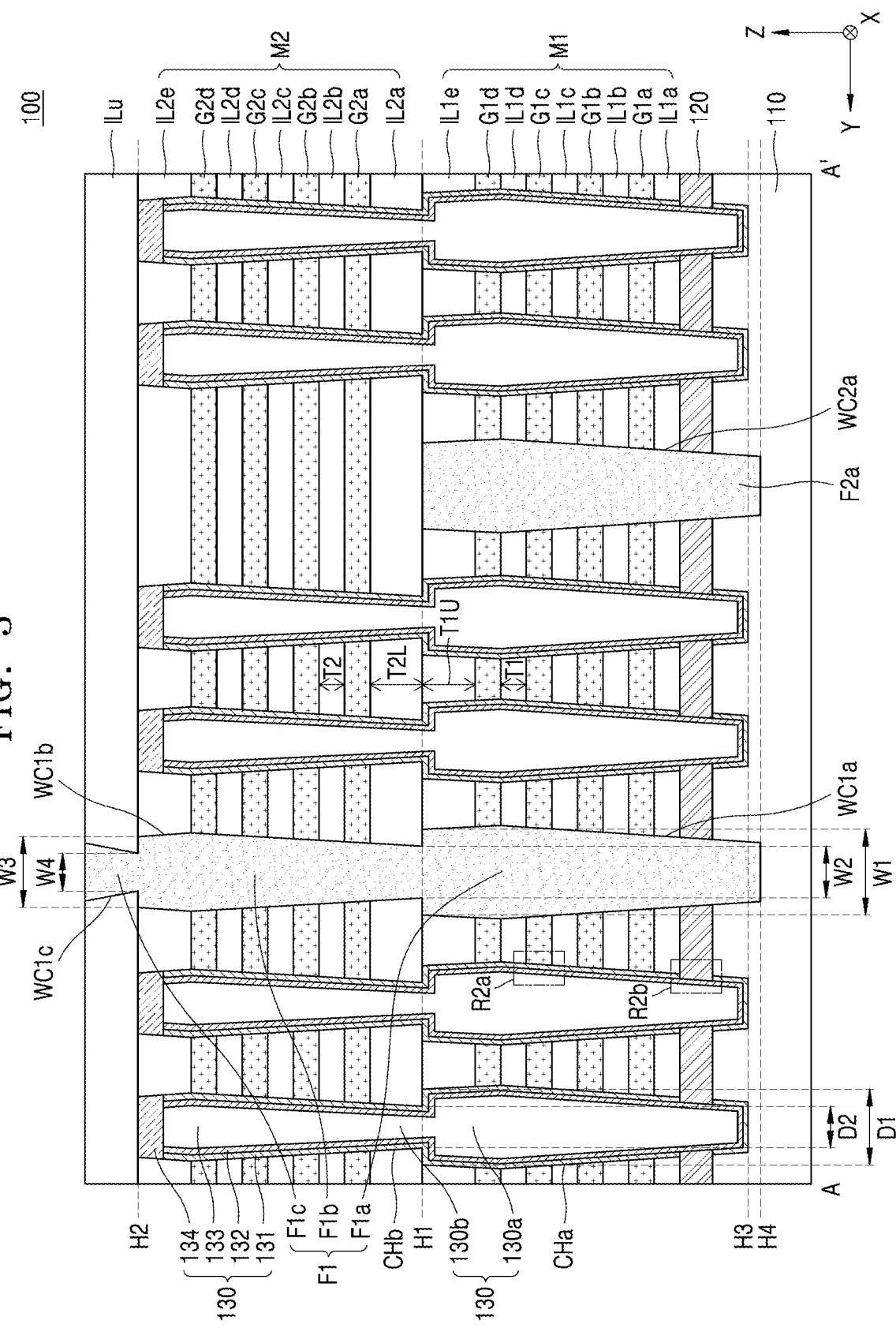
FIG. 3 is a cross-sectional view taken along line A-A' of FIG. 1.
Figure 4A:
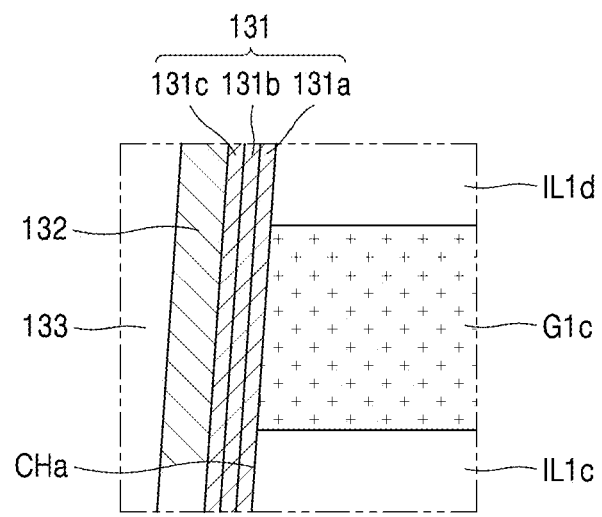
FIG. 4A is an enlarged cross-sectional view of area R2a of FIG. 3.
Figure 4B:
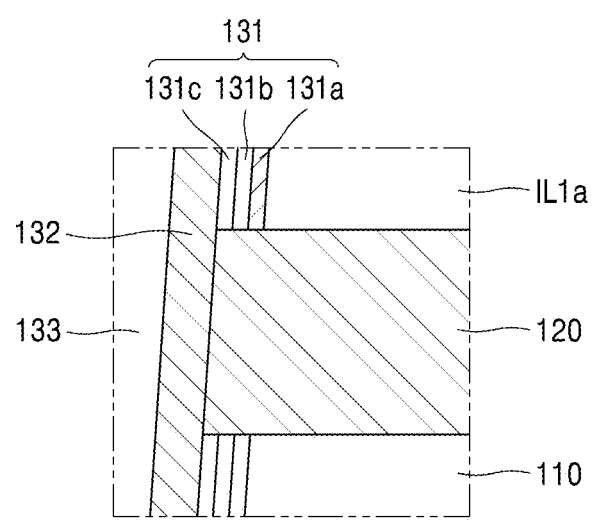
FIG. 4B is an enlarged cross-sectional view of area R2b of FIG. 3.

FIG. 1 is a plan view of a nonvolatile memory device 100 according to embodiments. FIG. 2 is a perspective view schematically illustrating area R1 of FIG. 1. FIG. 3 is a cross-sectional view taken along line A-A' of FIG. 1. FIG. 4A is an enlarged cross-sectional view of area R2a of FIG. 3. FIG. 4B is an enlarged cross-sectional view of area R2b of FIG. 3.

Referring to FIGS. 1 to 4B, the nonvolatile memory device 100 may include a substrate 110, a first stacked structure M1 on the substrate 110, a second stacked structure M2 on the first stacked structure M1, a channel structure 130 passing through the first stacked structure M1 and the second stacked structure M2, a first filling structure F1, and a second filling structure F2.

The substrate 110 may include a cell area CELL and a step area PR surrounding the cell area CELL. The first stacked structure M1 may be on the cell area CELL and the step area PR of the substrate 110. The second stacked structure M2 may be on the first stacked structure M1. A portion of the first stacked structure M1 and the second stacked structure M2 on the step area PR may have a step shape. That is, the higher gate layers G1a to G1d and G2a to G2d are, the smaller the plane area may be. For example, a less planar area of the uppermost gate layer G2d may be less than that of the lower gate layer G2c.

The substrate 110 may include a semiconductor material, such as a Group IV semiconductor material, a Group III-V semiconductor material, a Group II-VI semiconductor material, or a combination thereof. The Group IV semiconductor material may include, for example, silicon (Si), germanium (Ge), or a combination thereof. The Group III-V semiconductor material may include, for example, gallium arsenide (GaAs), indium phosphorus (InP), gallium phosphorus (GaP), indium arsenic (InAs), indium antimony (InSb), indium gallium arsenide (InGaAs), or a combination thereof. The Group II-VI semiconductor material may include, for example, zinc telluride (ZnTe), cadmium sulfide (CdS), or a combination thereof. The substrate 110 may be a bulk wafer or an epitaxial layer.

The first stacked structure M1 may include a plurality of first gate layers G1a to G1d and a plurality of first interlayer insulating layers IL1a to IL1e alternately stacked on the substrate 110. FIGS. 1 to 3 show that the first stacked structure M1 includes four first gate layers G1a to G1d and five first interlayer insulating layers IL1a to IL1e, but the number of first gate layers and the number of first interlayer insulating layers included in the first stacked structure M1 may be different than 4 and 5, respectively, such as greater than 4 and 5, respectively.

The second stacked structure M2 may include a plurality of second gate layers G2a to G2d and a plurality of second interlayer insulating layers IL2a to IL2e alternately stacked on the first stacked structure M1. FIGS. 1 to 3 show that the second stacked structure M2 includes four second gate layers G2a to G2d and five second interlayer insulating layers IL2a to IL2e, but the number of second gate layers and the number of second interlayer insulating layers included in the second stacked structure M2 may be different than 4 and 5, respectively, such as greater than 4 and 5, respectively. Also, in some embodiments, the number of first gate electrodes included in the first stacked structure M1 may be different from the number of second gate electrodes included in the second stacked structure M2, and the number of first interlayer insulating layers included in the first stacked structure M1 may be different from the number of second interlayer insulating layers included in the second stacked structure M2.

In some embodiments, a thickness T1U of the uppermost interlayer insulating layer IL1e from among the plurality of first interlayer insulating layers IL1a to IL1e may be greater than a thickness T1 of one (e.g., IL1d) of the plurality of first interlayer insulating layers IL1a to IL1e. Also, in some embodiments, a thickness T2L of the lowermost interlayer insulating layer IL2a from among the plurality of second interlayer insulating layers IL2a to IL2e may be greater than a thickness T2 of one (e.g., IL2b) of the plurality of second interlayer insulating layers IL2a to IL2e.

The plurality of first gate layers G1a to G1d and the plurality of second gate layers G2a to G2d may include tungsten (W), copper (Cu), silver (Ag), gold (Au), aluminum (Al), or a combination thereof, but may include a conductive material, though not limited thereto. The first gate layers G1a to G1d and the second gate layers G2a to G2d may include titanium (Ti), tantalum (Ta), titanium nitride (TiN), tantalum nitride (TaN), or a combination thereof to limit and/or prevent diffusion of the conductive material into the plurality of first interlayer insulating layers IL1a to IL1e and the plurality of second interlayer insulating layers IL2a to IL2e, but may further include a barrier material, though not limited thereto.

The plurality of first interlayer insulating layers IL1a to IL1e and the plurality of second interlayer insulating layers IL2a to IL2e may include, for example, silicon oxide, silicon nitride, a low dielectric (low-K) material, or a combination thereof. The low-K material is a material having a lower dielectric constant than that of silicon oxide, and may include, for example, phosphosilicate glass (PSG), borophosphosilicate glass (BPSG), fluorosilicate glass (FSG), organosilicate glass (OSG), spin-on-glass (SOG), spin-on-polymer, or a combination thereof.

The channel structure 130 may pass through portions of the first stacked structure M1 and the second stacked structure M2 on the cell area CELL. The channel structure 130 may include a first portion 130a passing through the first stacked structure M1 and a second portion 130b passing through the second stacked structure M2. The first portion 130a of the channel structure 130 may be in a first channel hole CHa passing through the first stacked structure M1, and the second portion 130b of the channel structure 130 may be in a second channel hole CHb passing through the stacked structure M2. The second portion 130b of the channel structure 130 may be on the first portion 130a of the channel structure 130. In some embodiments, a diameter D1 of an upper end of the first portion 130a of the channel structure 130 may be greater than a diameter D2 of a lower end of the second portion 130b of the channel structure 130.

The channel structure 130 may include a gate insulating layer 131 in the first channel hole CHa and the second channel hole CHb and a channel layer 132 on the gate insulating layer 131. In some embodiments, the channel structure 130 may further include a filling insulating layer 133 in a space surrounded by the channel layer 132 and a channel pad 134 on the filling insulating layer 133.

The gate insulating layer 131 may extend along a side surface and bottom of the first channel hole CHa and along a side surface of the second channel hole CHb. In some embodiments, unlike the example shown in FIG. 3, the gate insulating layer 131 may further extend between the second channel hole CHb and the channel pad 134. As shown in FIG. 4A, the gate insulating layer 131 may include a blocking insulating layer 131a, a charge storage layer 131b, and a tunneling insulating layer 131c that are sequentially stacked in the first channel hole CHa and the second channel hole CHb. The blocking insulating layer 131a may include, for example, silicon oxide, silicon nitride, metal oxide having a higher dielectric constant than silicon oxide, or a combination thereof. The metal oxide may include, for example, hafnium oxide, aluminum oxide, zirconium oxide, tantalum oxide, or a combination thereof. The charge storage layer 131b may include, for example, silicon nitride, boron nitride, polysilicon, or a combination thereof. The tunneling insulating layer 131c may include, for example, metal oxide or silicon oxide. In some embodiments, the blocking insulating layer 131a, the charge storage layer 131b, and the tunneling insulating layer 131c may include oxide, nitride, and oxide, respectively.

The channel layer 132 may extend along the gate insulating layer 131. The channel layer 132 may include a semiconductor material such as a Group IV semiconductor material, a Group III-V semiconductor material, or a Group II-VI semiconductor material. In some embodiments, the channel layer 132 may include polysilicon.

The filling insulating layer 133 may include an insulating material that may include, for example, silicon nitride, silicon oxide, or a combination thereof. In some embodiments, the filling insulating layer 133 may include silicon oxide.

The channel pad 134 is above the second channel hole CHb and may contact the channel layer 132. The channel pad 134 may include a semiconductor material such as Si, Ge, and Si—Ge; a metallic material such as W, Ti, Al, Cu, Au, and Ag; a metal nitride such as TiN or TaN; or a conductive material such as a combination thereof. In some embodiments, the channel pad 134 may include polysilicon.

The first filling structure F1 may include a first portion F1a passing through the first stacked structure M1 and a second portion F1b passing through the second stacked structure M2. The first portion F1a of the first filling structure F1 may be in a first word line cut WC1a passing through the first stacked structure M1. The second portion F1b of the first filling structure F1 may be in a second word line cut WC1b passing through the second stacked structure M2. The second portion F1b of the first filling structure F1 is on the first portion F1a of the first filling structure F1 and may extend along the first filling structure F1. In some embodiments, a width W1 of an upper end of the first portion F1a of the first filling structure F1 in a second horizontal direction (Y direction) may be greater than a width W2 of a lower end of the second portion F1b of the first filling structure F1 in the second horizontal direction (Y direction).

The first portion F1a of the first filling structure F1 may extend in a first horizontal direction (X direction). That is, the first word line cut WC1a may extend in the first horizontal direction (X direction). The first portion F1a of the first filling structure F1 may completely pass through the first stacked structure M1 in the first horizontal direction (X direction). That is, the first word line cut WC1a may completely pass through the first stacked structure M1 in the first horizontal direction (X direction).

The second portion F1b of the first filling structure F1 may extend in the first horizontal direction (X direction). That is, the second word line cut WC1b may extend in the first horizontal direction (X direction). The second portion F1b of the first filling structure F1 may completely pass through the second stacked structure M2 in the first horizontal direction (X direction). That is, the second word line cut WC1b may completely pass through the second stacked structure M2 in the first horizontal direction (X direction).

As shown in FIG. 1, a length L1 of the first filling structure F1 in the first horizontal direction (X direction) may be greater than a width W5 of the first filling structure F1 in the second horizontal direction (Y direction).

The second filling structure F2 may include a first portion F2a passing through the first stacked structure M1, a second portion F2b passing through the second stacked structure M2, and a third portion F2c passing through the second stacked structure M2. The first portion F2a of the second filling structure F2 may be in a third word line cut WC2a passing through the first stacked structure M1. The second portion F2b of the second filling structure F2 may be in a fourth word line cut WC2b passing through the second stacked structure M2. The third portion F2c of the second filling structure F2 may be in a fifth word line cut WC2c passing through the second stacked structure M2. The second portion F2b and the third portion F2c of the second filling structure F2 may be on the first portion F2a of the second filling structure F2.

The first portion F2a of the second filling structure F2 may extend in the first horizontal direction (X direction). That is, the third word line cut WC2a may extend in the first horizontal direction (X direction). The first portion F2a of the second filling structure F2 may completely pass through the first stacked structure M1 in the first horizontal direction (X direction). That is, the third word line cut WC2a may completely pass through the first stacked structure M1 in the first horizontal direction (X direction).

The second portion F2b and the third portion F2c of the second filling structure F2 may extend in the first horizontal direction (X direction). That is, the fourth word line cut WC2b and the fifth word line cut WC2c may extend in the first horizontal direction (X direction). The second portion F2b and the third portion F2c of the second filling structure F2 may partially pass through the second stacked structure M2 in the first horizontal direction (X direction). That is, the fourth word line cut WC2b and the fifth word line cut WC2c may only partially pass through the second stacked structure M2 in the first horizontal direction (X direction). The second portion F2b of the second filling structure F2 may be apart from the third portion F2c of the second filling structure F2 in the first horizontal direction (X direction).

As shown in FIG. 2, a length L2 of the first portion F2a of the second filling structure F2 in the first horizontal direction (X direction) may be greater than a length L3 of the second portion F2b of the second filling structure F2 in the first horizontal direction (X direction).

The third word line cut WC2a may be apart from the first word line cut WC1a in the second horizontal direction (Y direction). The fourth word line cut WC2b may be apart from the second word line cut WC1b in the second horizontal direction (Y direction). The fifth word line cut WC2c may be apart from the second word line cut WC1b in the second horizontal direction (Y direction). The fourth word line cut WC2b may be apart from the fifth word line cut WC2c in the first horizontal direction (X direction). The fourth word line cut WC2b and the fifth word line cut WC2c may be connected to the third word line cut WC2a.

As shown in FIG. 2, the first stacked structure M1 may include a first sub-stack SS1, a second sub-stack SS2, and a third sub-stack SS3. The first sub-stack SS1 and the second sub-stack SS2 may be apart from each other by the first portion F1a of the first filling structure F1. The second sub-stack SS2 and the third sub-stack SS3 may be apart from each other by the first portion F2a of the second filling structure F2.

The second stacked structure M2 may include a fourth sub-stack SS4, a fifth sub-stack SS5, a sixth sub-stack SS6, and a connection stack CS. The fourth sub-stack SS4, the fifth sub-stack SS5, and the sixth sub-stack SS6 may be on the first sub-stack SS1, the second sub-stack SS2, and the third sub-stack SS3, respectively. The fourth sub-stack SS4 and the fifth sub-stack SS5 may be apart from each other by the second portion F1b of the first filling structure F1. The connection stack CS may connect the fifth sub-stack SS5 to the sixth sub-stack SS6. The connection stack CS may be on the first portion F2a of the second filling structure F2. The second portion F2b and the third portion F2c of the second filling structure F2 may be apart from each other by the connection stack CS. The connection stack CS may limit and/or prevent the fifth sub-stack SS5 and the sixth sub-stack SS6 from tilting during a manufacturing process of the nonvolatile memory device 100.

The first filling structure F1 and the second filling structure F2 may include an insulating material that may include, for example, silicon oxide, silicon nitride, a low-K material, or a combination thereof.

The upper end of the first portion F1a of the first filling structure F1 may be at a same height H1 as the upper end of the first portion 130a of the channel structure 130. In this specification, the height H1 refers to a distance in a vertical direction (Z direction) from a flat bottom surface of the substrate 110. In other words, an upper end of the first word line cut WC1a may be at the same height H1 as an upper end of the first channel hole CHa. Also, the upper end of the first portion F1a of the first filling structure F1 may be at the same height H1 as an upper surface of the uppermost interlayer insulating layer IL1e from among the plurality of first interlayer insulating layers IL1a to IL1e. In some embodiments, the upper end of the first portion F1a of the first filling structure F1, the upper end of the first portion 130a of the channel structure 130, and the upper surface of the uppermost interlayer insulating layer IL1e may lie on the same virtual surface.

An upper end of the first portion F2a of the second filling structure F2 may be at the same height H1 as the upper end of the first portion 130a of the channel structure 130. In other words, an upper end of the third word line cut WC2a may be at the same height H1 as the upper end of the first channel hole CHa. Also, the upper end of the first portion F2a of the second filling structure F2 may be at the same height H1 as the upper surface of the uppermost interlayer insulating layer IL1e from among the plurality of first interlayer insulating layers IL1a to IL1e. In some embodiments, the upper end of the first portion F2a of the second filling structure F2, the upper end of the first portion 130a of the channel structure 130, and the upper surface of the uppermost interlayer insulating layer IL1e may lie on the same virtual surface.

In some embodiments, as shown in FIG. 3, the nonvolatile memory device 100 may further include a lower conductive layer 120 between the substrate 110 and the first stacked structure M1. The channel structure 130, the first filling structure F1, the second filling structure F2, the first word line cut WC1a, the second filling structure F2, and the third word line cut WC2a may further pass through the lower conductive layer 120. The channel structure 130, the first channel hole CHa, the first filling structure F1, the first word line cut WC1a, the second filling structure F2, and the third word line cut WC2a may further partially pass through the substrate 110.

In some embodiments, a height H4 of a lower end of the first word line cut WC1a may be less than a height H3 of a lower end of the first channel hole CHa. That is, the height H4 of a lower end of the first filling structure F1 may be less than the height H3 of a lower end of the channel structure 130. Similarly, the height H4 of a lower end of the third word line cut WC2a may be less than the height H3 of the lower end of the first channel hole CHa. That is, the height H4 of a lower end of the first portion F2a of the second filling structure F2 may be less than the height H3 of a lower end of the first portion 130a of the channel structure 130. As shown in FIG. 4B, the lower conductive layer 120 may pass through the gate insulating layer 131 and contact the channel layer 132.

The lower conductive layer 120 may include a metal such as W, Al, Au, Ag, or Cu; a metal nitride such as TiN, molybdenum nitride (MoN), or TaN; a semiconductor material such as Si, Ge, or Si—Ge; or a combination thereof. In some embodiments, the lower conductive layer 120 may include polysilicon.

In some embodiments, the nonvolatile memory device 100 may further include the second stacked structure M2 and an upper insulating layer ILu on the channel structure 130. The first filling structure F1 may further pass through the upper insulating layer ILu. For example, the first filling structure F1 may further include a third portion F1c passing through the upper insulating layer ILu. The third portion F1c of the first filling structure F1 may be in a sixth word line cut WC1c passing through the upper insulating layer ILu. The third portion F1c of the first filling structure F1 may be on the second portion F1b of the first filling structure F1. The upper insulating layer ILu may include, for example, an insulating material that may include silicon oxide, silicon nitride, a low-K material, or a combination thereof.

In some embodiments, a width W3 of an upper end of the second portion F1b of the first filling structure F1 in the second horizontal direction (Y direction) may be greater than a width W4 of an upper end of the third portion F1c of the first filling structure F1 in the second horizontal direction (Y direction). In some embodiments, an upper end of the second portion F1b of the first filling structure F1 may be at a same height H2 as an upper end of the channel structure 130. In some embodiments, an upper surface of the uppermost interlayer insulating layer IL2e from among the plurality of second interlayer insulating layers IL2a to IL2e may be at the same height as the upper end of the second portion F1b of the first filling structure F1. In some embodiments, the upper surface of the channel structure 130, the upper end of the second portion F1b of the first filling structure F1, and the upper surface of the uppermost interlayer insulating layer IL2e may lie on the same virtual surface.

Figure 5:
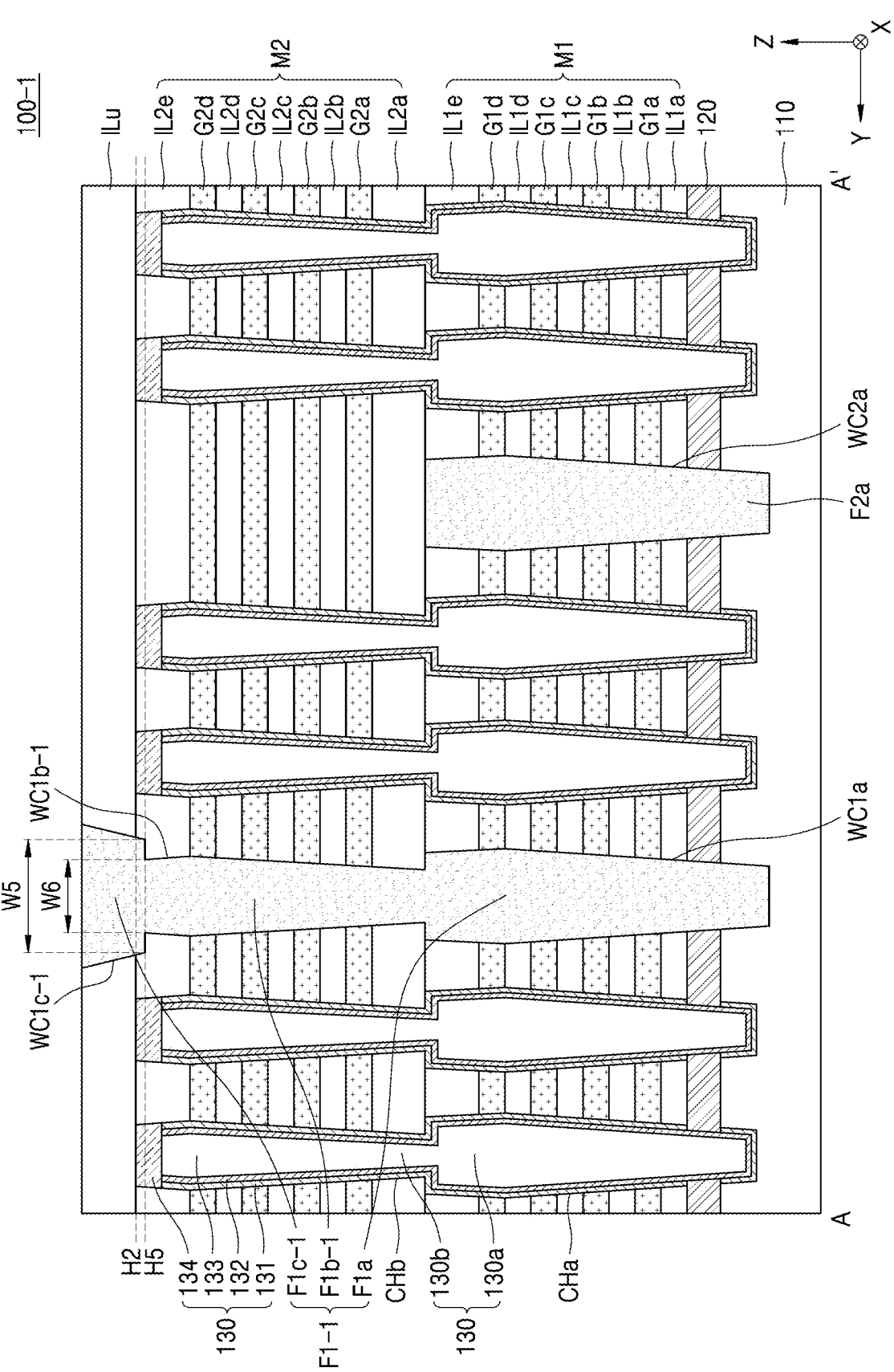
FIG. 5 is a cross-sectional view of a nonvolatile memory device according to embodiments.

FIG. 5 is a cross-sectional view of a nonvolatile memory device 100-1 according to embodiments. Hereinafter, differences between the nonvolatile memory device 100-1 illustrated in FIG. 5 and the nonvolatile memory device 100 illustrated in FIG. 3 will be described.

Referring to FIG. 5, the nonvolatile memory device 100-1 may include a first filling structure F1-1. The first filling structure F1-1 may include a second portion F1*b*-1 passing through the second stacked structure M2, and a third portion F1*c*-1 passing through the upper insulating layer ILu. The second portion F1*b*-1 of the first filling structure F1-1 may be in a second word line cut WC1*b*-1 passing through the second stacked structure M2. The third portion F1*c*-1 of the first filling structure F1-1 may be in a sixth word line cut WC1*c*-1 passing through the upper insulating layer ILu.

In some embodiments, the third portion F1*c*-1 of the first filling structure F1-1 may partially further pass through the second stacked structure M2. That is, the sixth word line cut WC1*c*-1 may further partially pass through the second stacked structure M2. A height H5 of an upper end of the second portion F1*b*-1 of the first filling structure F1-1 may be less than the height H2 of an upper end of the second portion 130*b* of the channel structure 130. That is, the height H5 of an upper end of the second word line cut WC1*b*-1 may be less than the height H2 of the upper end of the second portion 130*b* of the channel structure 130. The height H5 of the upper end of the second portion F1*b*-1 of the first filling structure F1-1 may be less than the height H2 of the upper surface of the uppermost insulating layer IL2*e* from among the plurality of second interlayer insulating layers IL2*a* to IL2*e*. That is, the height H5 of the upper end of the second word line cut WC1*b*-1 may be less than the height H2 of the upper surface of the uppermost insulating layer IL2*e*.

A width W6 of the upper end of the second portion F1*b*-1 of the first filling structure F1-1 in the second horizontal direction (Y direction) may be less than the width W5 of a lower end of the third portion F1*c*-1 of the first filling structure F1-1 in the second horizontal direction (Y direction). Accordingly, due to over-etching, the sixth word line cut WC1*c*-1 may be formed to partially pass through the second stacked structure M2.

Figure 6:
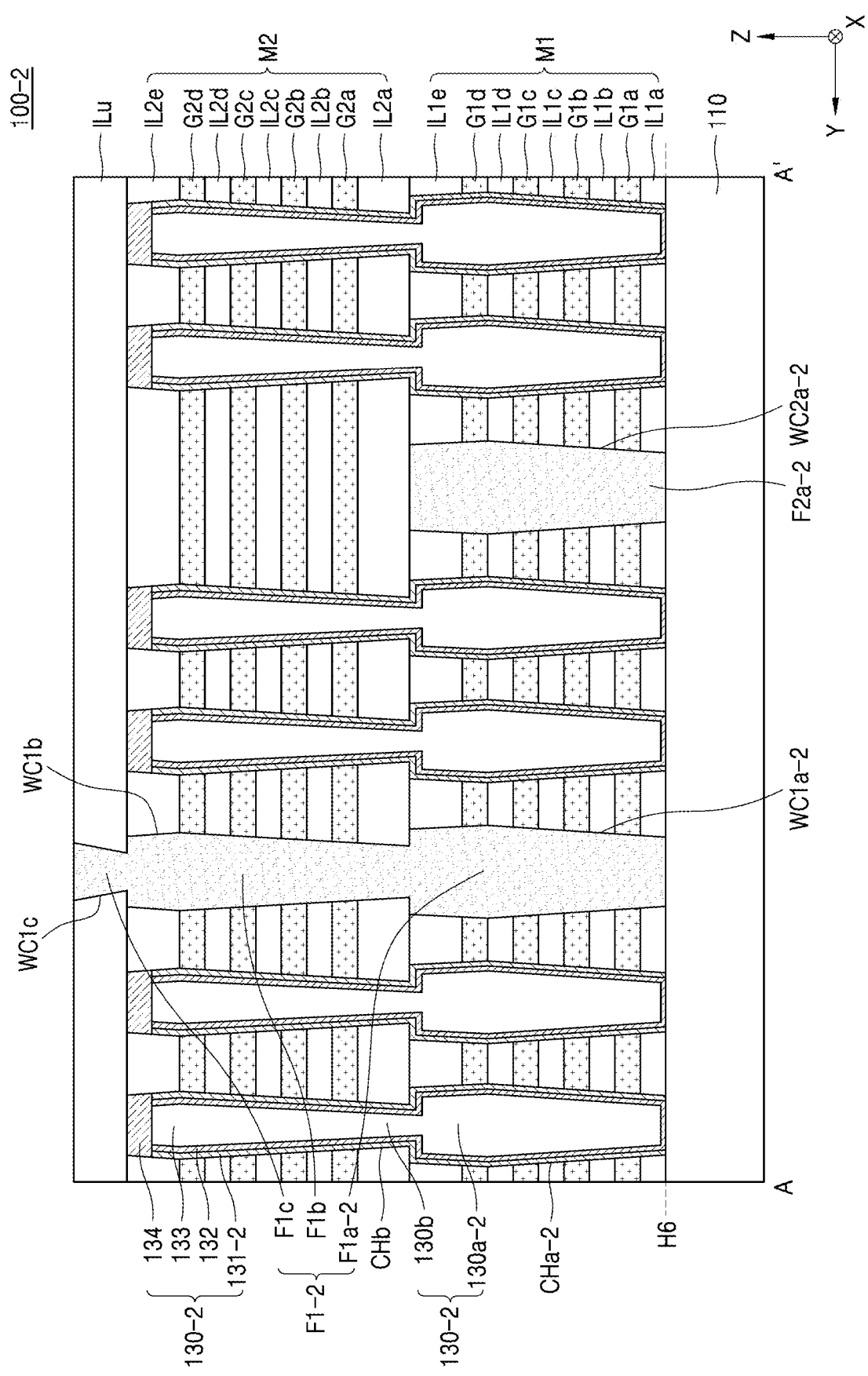
FIG. 6 is a cross-sectional view of a nonvolatile memory device according to embodiments.

FIG. 6 is a cross-sectional view of a nonvolatile memory device 100-2 according to embodiments. Hereinafter, differences between the nonvolatile memory device 100-2 illustrated in FIG. 6 and the nonvolatile memory device 100 illustrated in FIG. 3 will be described.

Referring to FIG. 6, the nonvolatile memory device 100-2 may not include the lower conductive layer 120 (see FIG. 3). In some embodiments, the first stacked structure M1 may be formed directly on the substrate 110.

The nonvolatile memory device 100-2 may include a channel structure 130-2. The channel structure 130-2 may include a first portion 130*a*-2 passing through the first stacked structure M1. The first portion 130*a*-2 of the channel structure 130-2 may be in a first channel hole CHa-2 passing through the first stacked structure M1. The channel structure 130-2 may include a gate insulating layer 131-2 in the first channel hole CHa-2 and the second channel hole CHb. The gate insulating layer 131-2 may not cover the bottom of the first channel hole CHa-2. Thus, in some embodiments, the channel layer 132 may directly contact the substrate 110.

The nonvolatile memory device 100-2 may include a first filling structure F1-2. The first filling structure F1-2 may include a first portion F1*a*-2 passing through the first stacked structure M1. The first portion F1*a*-2 of the first filling structure F1-2 may be in a first word line cut WC1*a*-2 passing through the first stacked structure M1.

The nonvolatile memory device 100-2 may include a second filling structure. The second filling structure may include a first portion F2*a*-2 passing through the first stacked structure M1. The first portion F2*a*-2 of the second filling structure may be in a third word line cut WC2*a*-2 passing through the first stacked structure M1.

In some embodiments, a lower end of the first portion F1*a*-2 of the first filling structure F1-2 may be at a same height H6 as a lower end of the first portion 130*a*-2 of the channel structure 130. That is, a lower end of the first word line cut WC1*a*-2 may be at the same height H6 as a lower end of the first channel hole CHa-2. In addition, a lower end of the first portion F2*a*-2 of the second filling structure may be at the same height H6 as the lower end of the first portion 130*a*-2 of the channel structure 130. That is, a lower end of the third word line cut WC2*a*-2 may be at the same height H6 as the lower end of the first channel hole CHa-2.

Figure 7:
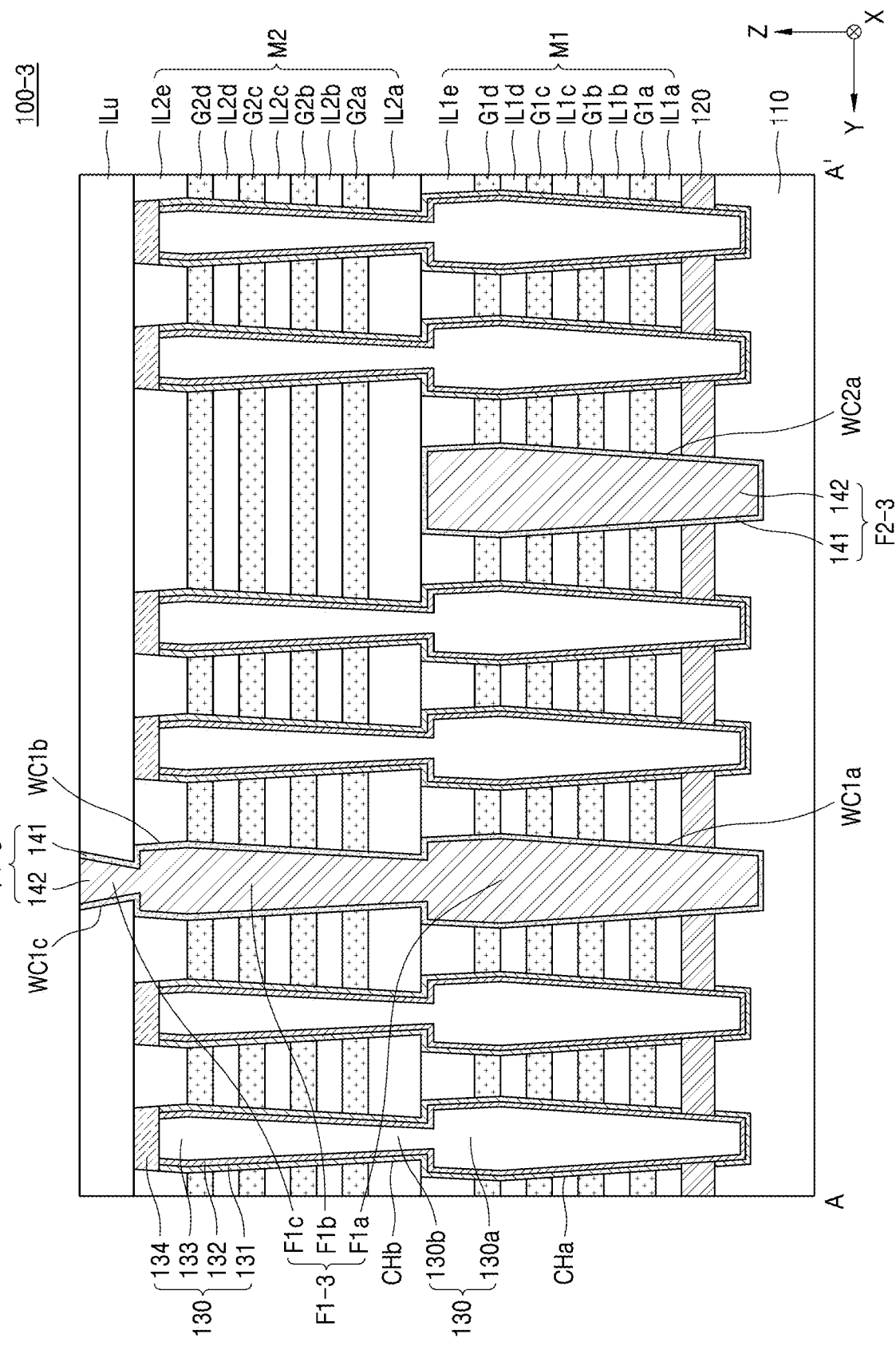
FIG. 7 is a cross-sectional view of a nonvolatile memory device according to embodiments.

FIG. 7 is a cross-sectional view of a nonvolatile memory device 100-3 according to embodiments. Hereinafter, differences between the nonvolatile memory device 100-3 illustrated in FIG. 7 and the nonvolatile memory device 100 illustrated in FIG. 3 will be described.

Referring to FIG. 7, the nonvolatile memory device 100-3 may include a first filling structure F1-3 and a second filling structure F2-3. Each of the first filling structure F1-3 and the second filling structure F2-3 may include an insulating layer 141 and a conductive layer 142 surrounded by the insulating layer 141.

The conductive layer 142 may pass through the first stacked structure M1 and the second stacked structure M2. In some embodiments, the conductive layer 142 may further pass through the upper insulating layer ILu. In some embodiments, the conductive layer 142 may further pass through the lower conductive layer 120. In some embodiments, the conductive layer 142 may further partially pass through the substrate 110.

The insulating layer 141 may extend between the conductive layer 142 and the first word line cut WC1*a* and between the conductive layer 142 and the second word line cut WC1*b*. In some embodiments, the insulating layer 141 may further extend between the conductive layer 142 and the sixth word line cut WC1*c*.

That is, the insulating layer 141 may extend between the conductive layer 142 and the first stacked structure M1 and between the conductive layer 142 and the second stacked structure M2. In some embodiments, the insulating layer 141 may further extend between the conductive layer 142 and the upper insulating layer ILu. In some embodiments, the insulating layer 141 may further extend between the conductive layer 142 and the lower conductive layer 120 and between the conductive layer 142 and the substrate 110.

The conductive layer 142 may include a metal such as tungsten (W), aluminum (Al), gold (Au), silver (Ag), or copper (Cu); a metal nitride such as titanium nitride (TiN), molybdenum nitride (MoN), or tantalum nitride (TaN); a semiconductor material such as silicon (Si), germanium (Ge), or Si—Ge; or a combination thereof. The insulating layer 141 may include an insulating material that may include, for example, silicon oxide, silicon nitride, a low-K material, or a combination thereof.

Figure 8:
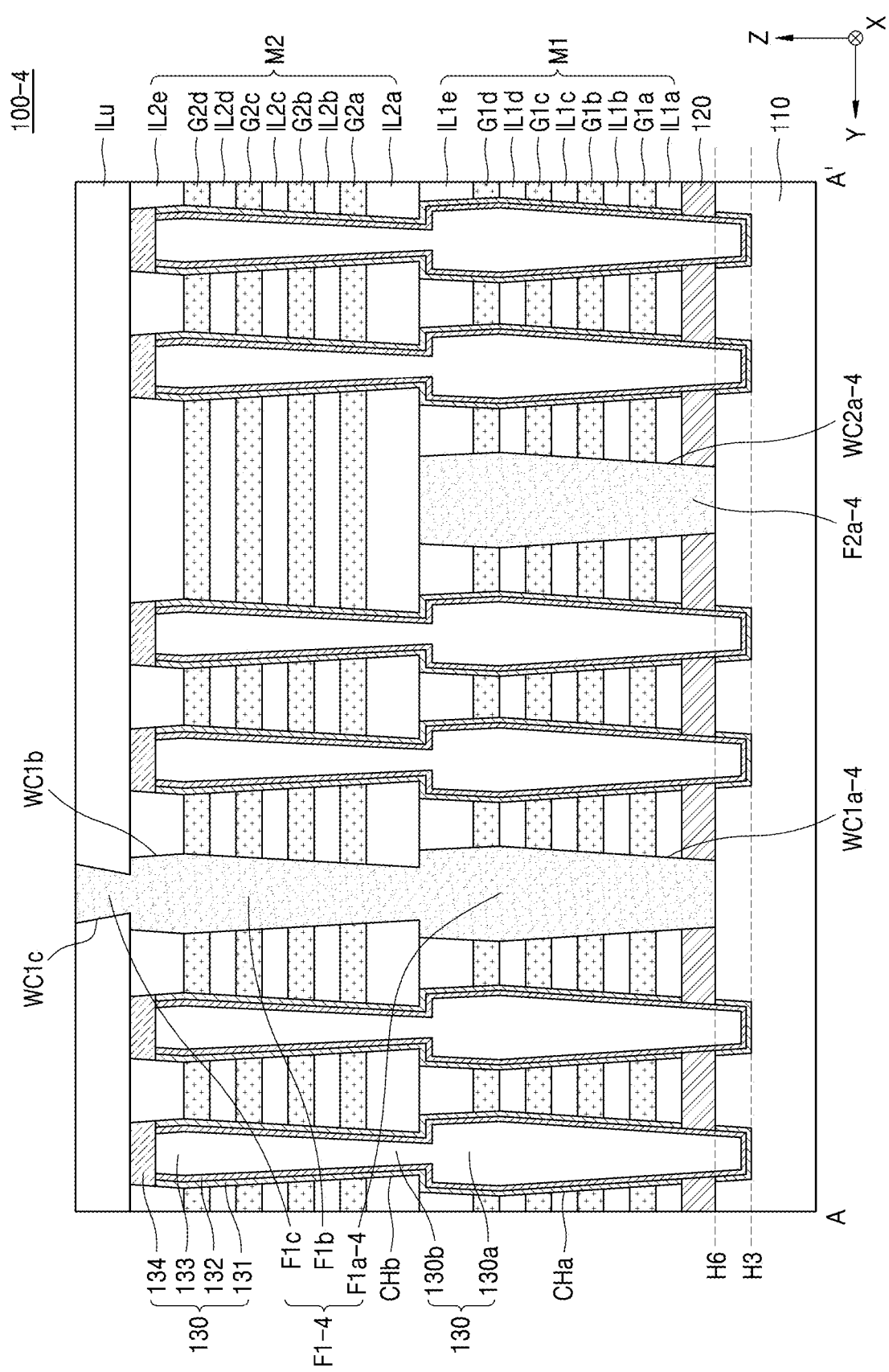
FIG. 8 is a cross-sectional view of a nonvolatile memory device according to embodiments.

FIG. 8 is a cross-sectional view of a nonvolatile memory device 100-4 according to embodiments. Hereinafter, differences between the nonvolatile memory device 100-4 illustrated in FIG. 8 and the nonvolatile memory device 100 illustrated in FIG. 3 will be described.

Referring to FIG. 8, the nonvolatile memory device 100-4 may include a first filling structure F1-4. The first filling structure F1-4 may include a first portion F1a-4 passing through the first stacked structure M1. The first portion F1a-4 of the first filling structure F1-4 may be in a first word line cut WC1a-4 passing through the first stacked structure M1.

The nonvolatile memory device 100-4 may include a second filling structure. The second filling structure may include a first portion F2a-4 passing through the first stacked structure M1. The first portion F2a-4 of the second filling structure may be in a third word line cut WC2a-4 passing through the first stacked structure M1.

In some embodiments, the first portion F1a-4 of the first filling structure F1-4 and the first portion F2a-4 of the second filling structure do not pass through the substrate 110, while the first portion 130a of the channel structure 130 may partially pass through the substrate 110. In other words, the first word line cut WC1a-4 and the third word line cut WC2a-4 do not pass through the substrate 110, while the first channel hole CHa may partially pass through the substrate 110.

In some embodiments, the height H6 of a lower end of the first portion F1a-4 of the first filling structure F1-4 may be greater than the height H3 of a lower end of the first portion 130a of the channel structure 130. That is, the height H6 of a lower end of the first word line cut WC1a-4 may be greater than the height H3 of the lower end of the first channel hole CHa. Also, the height H6 of a lower end of the first portion F2a-4 of the second filling structure may be greater than the height H3 of the lower end of the first portion 130a of the channel structure 130. In other words, the height H6 of a lower end of the third word line cut WC2a-4 may be greater than the height H3 of the lower end of the first channel hole CHa.

Figure 9:
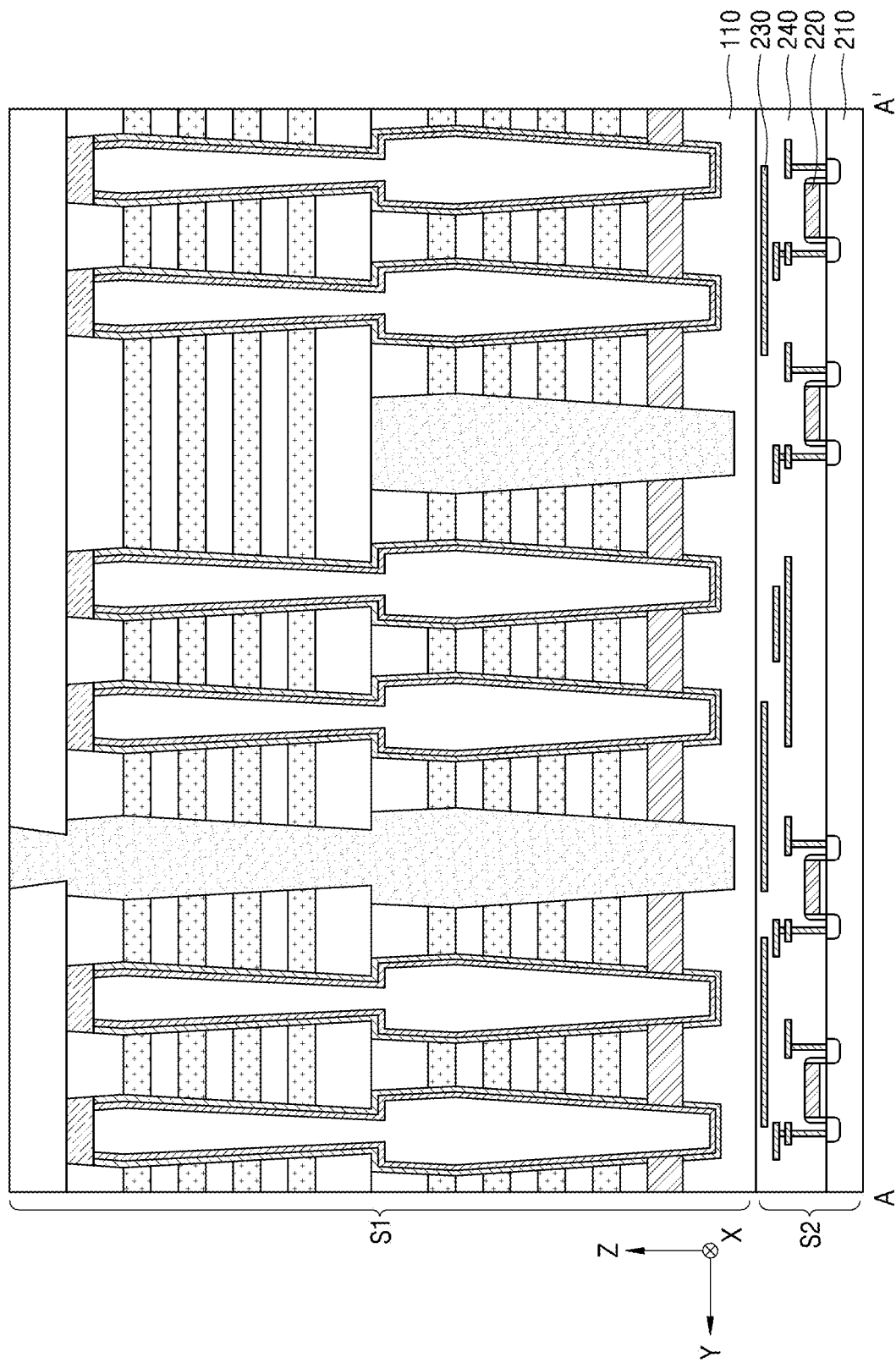
FIG. 9 is a cross-sectional view of a nonvolatile memory device according to embodiments.

FIG. 9 is a cross-sectional view of a nonvolatile memory device 100-5 according to embodiments.

Referring to FIG. 9, the nonvolatile memory device 100-5 may include a first structure S1 and a second structure S2 under the first structure S1. The first structure S1 may be one of the nonvolatile memory devices 100, 100-1, 100-2, 100-3, and 100-4 shown in FIGS. 1 to 8. The second structure S2 may include a lower substrate 210, a plurality of transistors 220 on the lower substrate 210, an insulating layer 240 covering the lower substrate 210 and the plurality of transistors 220, and a wire 230 in the insulating layer 240.

The lower substrate 210 may include a semiconductor material such as a Group IV semiconductor material, a Group III-V semiconductor material, or a Group II-VI semiconductor material. The lower substrate 210 may be a bulk wafer, and the substrate 110 may be an epitaxial layer. The interlayer insulating layer 240 may include an insulating material that may include silicon oxide, silicon nitride, a low dielectric material, or a combination thereof. The wire 230 may include, but is not limited to, a conductive material including tungsten (W), copper (Cu), silver (Ag), gold (Au), aluminum (Al), or a combination thereof. The wire 230 may include titanium (Ti), tantalum (Ta), titanium nitride (TiN), tantalum nitride (TaN), or a combination thereof for limiting and/or preventing diffusion of the conductive material in the wire 230 into the insulating layer 240, but may further include a barrier material, though not limited thereto.

The wire 230 may connect the plurality of transistors 220 to the first structure S1. The wire 230 and the plurality of transistors 220 may form a peripheral circuit. The peripheral circuit may include a decoder circuit, a logic circuit, and a page buffer.

FIGS. 10A to 10G and 10I to 10K are cross-sectional views illustrating a method of manufacturing a nonvolatile memory device, according to embodiments. FIG. 10H is an enlarged cross-sectional view of area R3 of FIG. 10G.

Figure 10A:
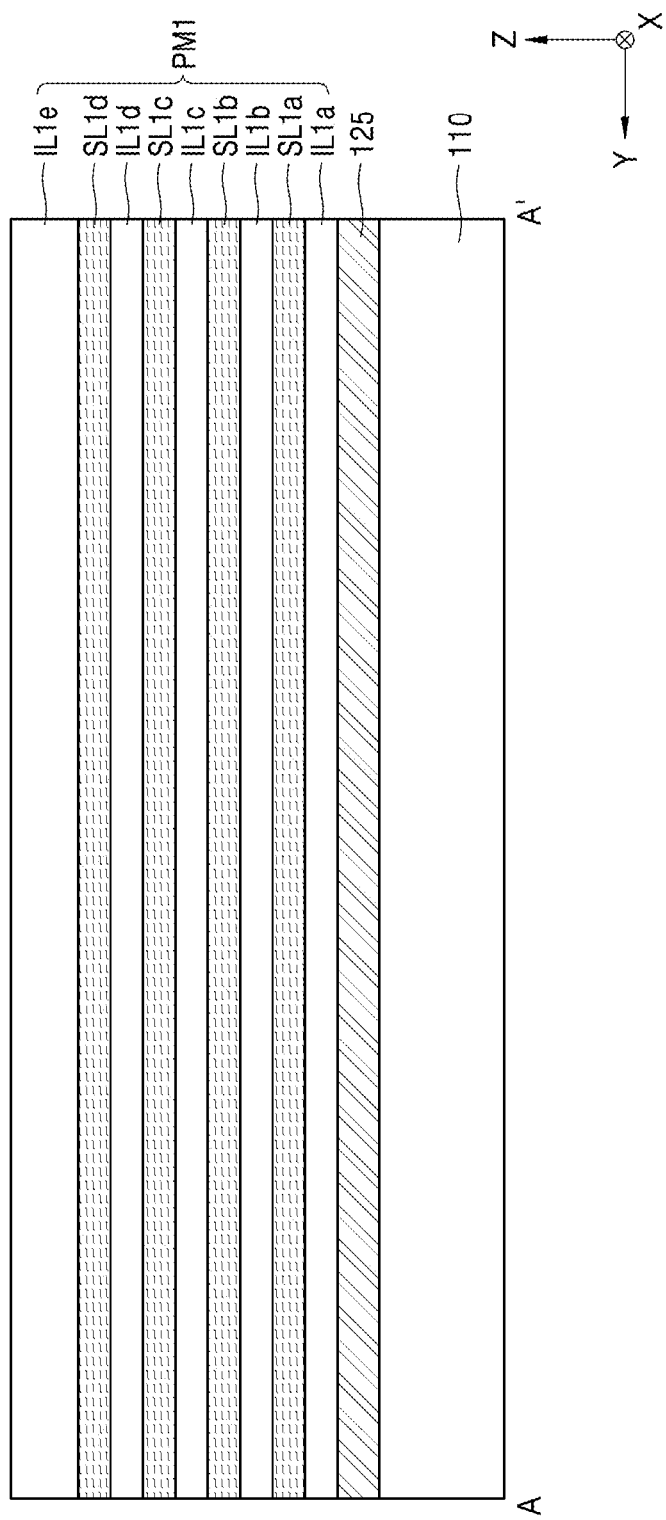

Referring to FIG. 10A, a lower sacrificial layer 125 may be formed on the substrate 110. A first preliminary stacked structure PM1 may be formed on the lower sacrificial layer 125. The first preliminary stacked structure PM1 may be formed by alternately forming the plurality of first interlayer insulating layers IL1a to IL1e and a plurality of first sacrificial layers SL1a to SL1d on the lower sacrificial layer 125. The first sacrificial layers SL1a to SL1d may include a material having an etch selectivity with respect to the first interlayer insulating layers IL1a to IL1e. In some embodiments, the first interlayer insulating layers IL1a to IL1e may include silicon oxide, and the first sacrificial layers SL1a to SL1d may include silicon nitride.

Figure 10B:
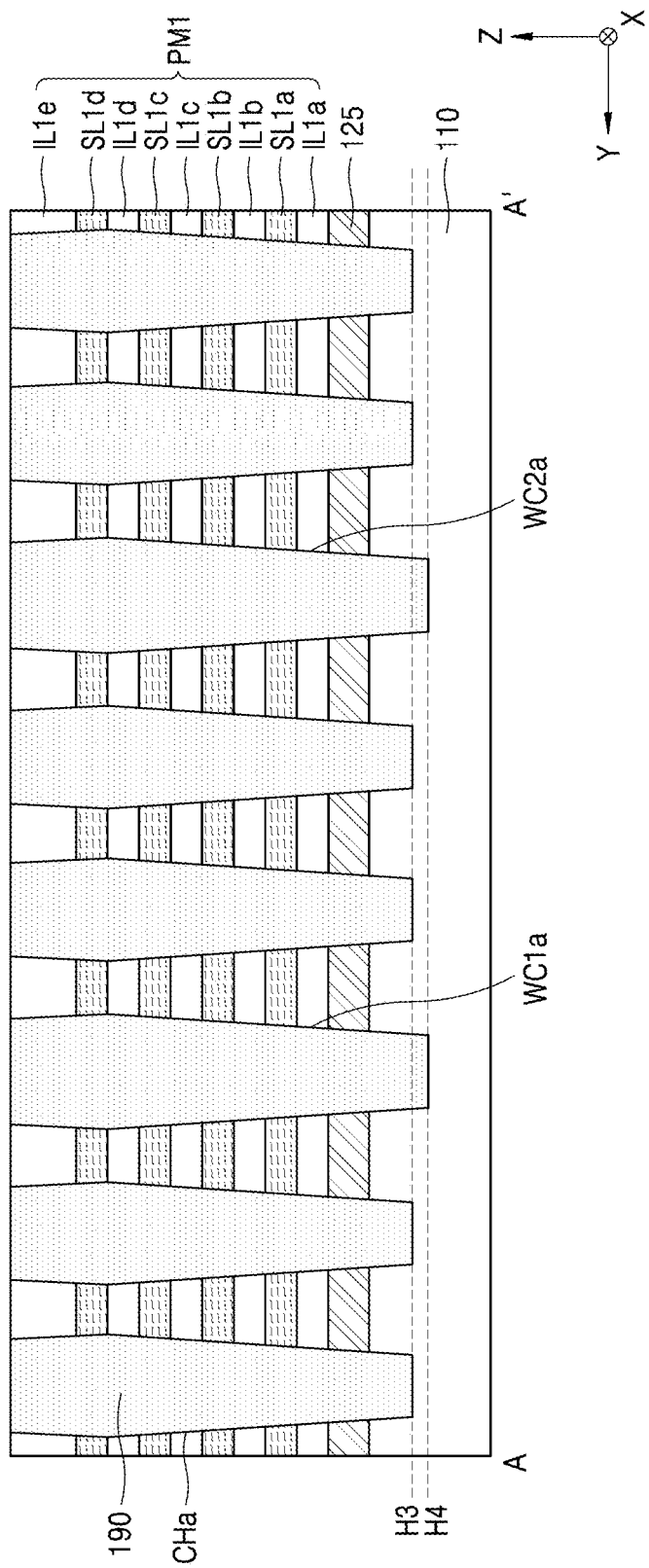

Referring to FIG. 10B, the first channel hole CHa, the first word line cut WC1a, and the third word line cut WC2a passing through the first preliminary stacked structure PM1 may be formed. In some embodiments, the first word line cut WC1a and the third word line cut WC2a may be formed together during an etching process of the first channel hole CHa. That is, the first channel hole CHa, the first word line cut WC1a, and the third word line cut WC2a may be etched for the same time under the same etching conditions. Because the first word line cut WC1a and the third word line cut WC2a are formed during the etching process of the first channel hole CHa, process operations may be reduced. Also, even if the number of layers stacked in the first preliminary stacked structure PM1 is increased to increase the degree of integration, it is not necessary to separately modify a process for forming the first word line cut WC1a and the third word line cut WC2a. Therefore, the manufacturing process may be simplified and the manufacturing cost may be saved.

In some embodiments, due to a difference between the shape of the first channel hole CHa in a plan view and the shapes of the first word line cut WC1a and the third word line cut WC2a in a plan view, the etching rate of the first channel hole CHa in the Z direction may be less than the etching rate of the first word line cut WC1a and the third word line cut WC2a in the Z direction. Accordingly, the height H3 of the lower end of the first channel hole CHa may be greater than the height H4 of a lower end of the first word line cut WC1a and the third word line cut WC2a. In another embodiment, the etching rate of the first channel hole CHa in the Z direction may be the same as the etching rate of the first word line cut WC1a and the third word line cut WC2a in the Z direction. Accordingly, the lower end of the first channel hole CHa may be at the same height as the lower end of the first word line cut WC1a and the third word line cut WC2a.

Next, a sacrificial filling layer 190 may be filled in the first channel hole CHa, the first word line cut WC1a, and the third word line cut WC2a. The sacrificial filling layer 190 may include a material having an etching selectivity with respect to the plurality of first interlayer insulating layers IL1a to IL1e and the plurality of first sacrificial layers SL1a to SL1d. In some embodiments, the plurality of first interlayer insulating layers IL1a to IL1e may include silicon oxide, the plurality of first sacrificial layers SL1a to SL1d may include silicon nitride, and the sacrificial filling layer 190 may include polysilicon.

Figure 10C:
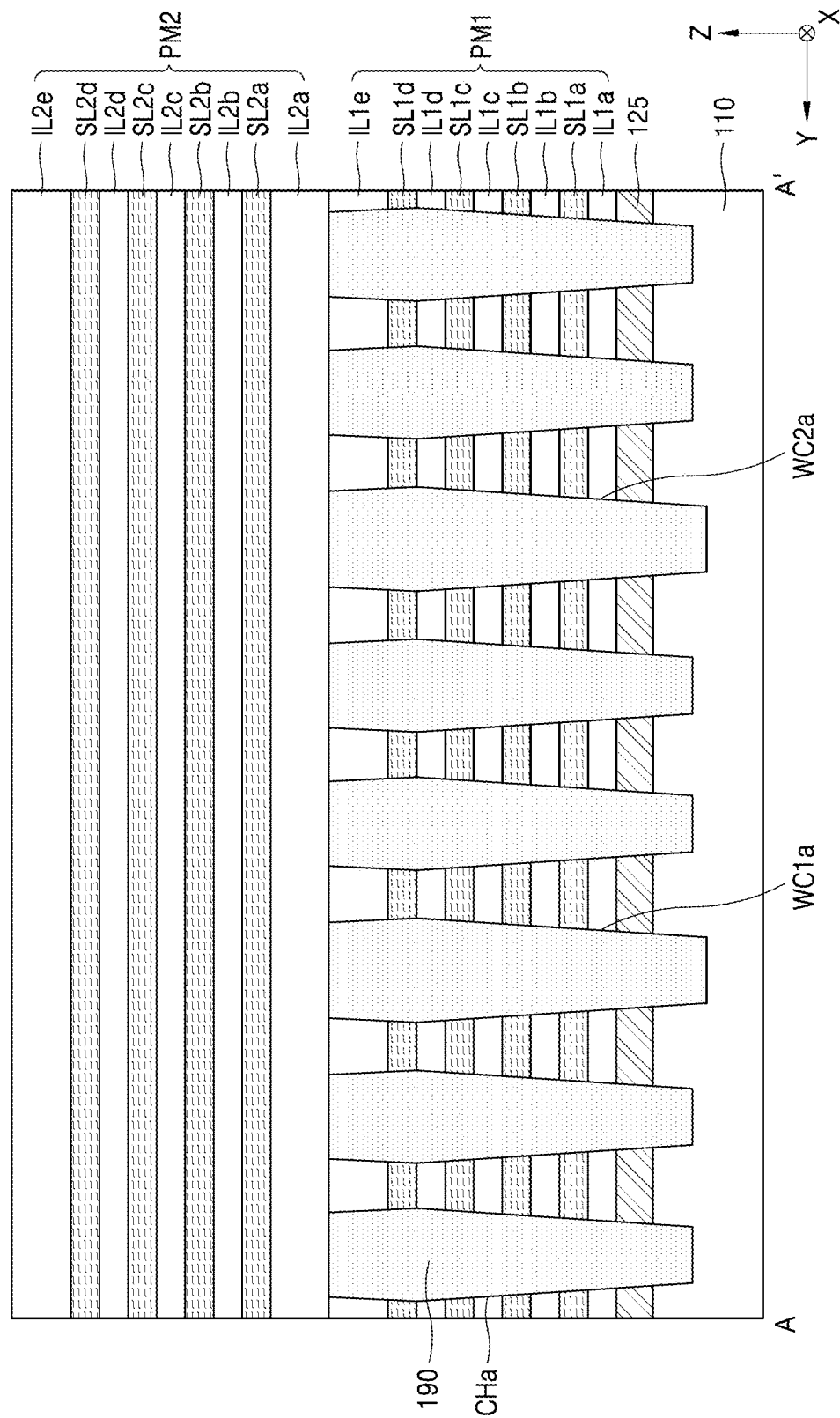

Referring to FIG. 10C, a second preliminary stacked structure PM2 may be formed on the first preliminary stacked structure PM1 and the sacrificial filling layer 190. The second preliminary stacked structure PM2 may be formed by alternately forming the plurality of second interlayer insulating layers IL2a to IL2e and a plurality of second sacrificial layers SL2a to SL2d on the first preliminary stacked structure PM1. The second sacrificial layers SL2a to SL2d may include a material having an etch selectivity with respect to the second interlayer insulating layers IL2a to IL2e. In some embodiments, the second interlayer insulating layers IL2a to IL2e may include silicon oxide, and the second sacrificial layers SL2a to SL2d may include silicon nitride.

Referring to FIG. 10D, the second channel hole CHb passing through the second preliminary stacked structure PM2 and exposing the sacrificial filling layer 190, the second word line cut WC1b, the fourth word line cut WC2b (see FIG. 2), and the fifth word line cut WC2c (see FIG. 2) may be formed. In some embodiments, the second word line cut WC1b, the fourth word line cut WC2b (see FIG. 2), and the fifth word line cut WC2c (see FIG. 2) may be formed together during an etching process of the second channel hole CHb. That is, the second channel hole CHb, the second word line cut WC1b, the fourth word line cut WC2b (see FIG. 2), and the fifth word line cut WC2c (see FIG. 2) may be etched for the same time under the same etching conditions. Because the second word line cut WC1b, the fourth word line cut WC2b (see FIG. 2), and the fifth word line cut WC2c (see FIG. 2) are formed during a process of forming the second channel hole CHb, the manufacturing process may be simplified and the manufacturing cost may be reduced.

Figure 10E:
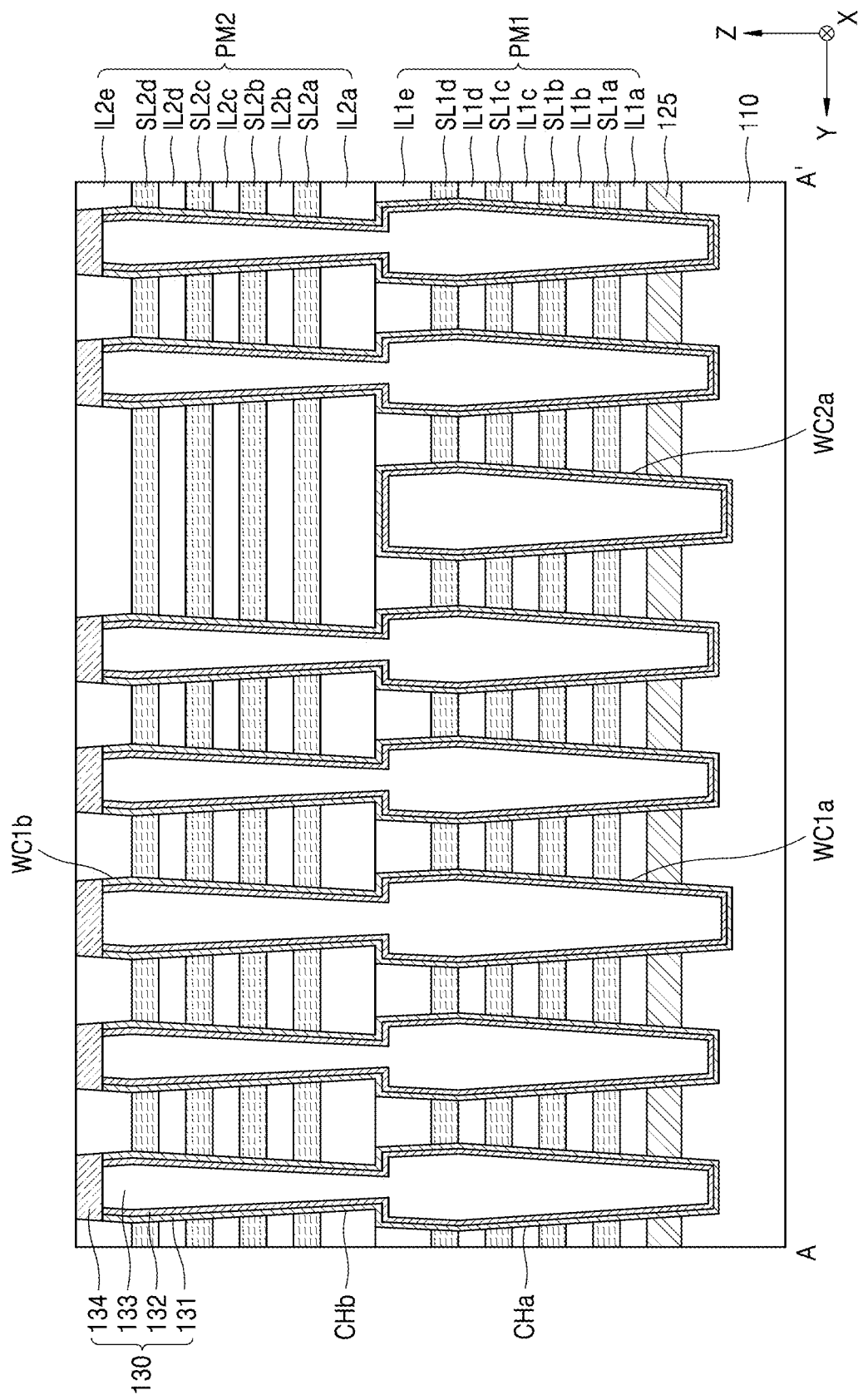

Referring to FIGS. 10D and 10E, the sacrificial filling layer 190 may be removed. That is, the sacrificial filling layer 190 may be selectively etched.

Next, the gate insulating layer 131 may be formed in the first channel hole CHa, the second channel hole CHb, the first word line cut WC1a, the second word line cut WC1b, the third word line cut WC2a, the fourth word line WC2b (see FIG. 2), and the fifth word line cut WC2c (see FIG. 2). The gate insulating layer 131 may be formed by sequentially forming, for example, the blocking insulating layer 131a (see FIG. 4A), the charge storage layer 131b, and the tunneling insulating layer 131c. Also, the channel layer 132 may be formed on the gate insulating layer 131. In addition, the filling insulating layer 133 may be formed on the channel layer 132.

Next, an upper portion of the filling insulating layer 133, the channel layer 132, and the gate insulating layer 131 may be removed. Next, the channel pad 134 may be formed on the filling insulating layer 133, the channel layer 132, and the gate insulating layer 131. In another embodiment, the channel pad 134 may be formed on the filling insulating layer 133 after only the upper portion of the filling insulating layer 133 is removed. The gate insulating layer 131, the channel layer 132, the filling insulating layer 133, and the channel pad 134 in the first channel hole CHa and the second channel hole CHb may form the channel structure 130.

Figure 10F:
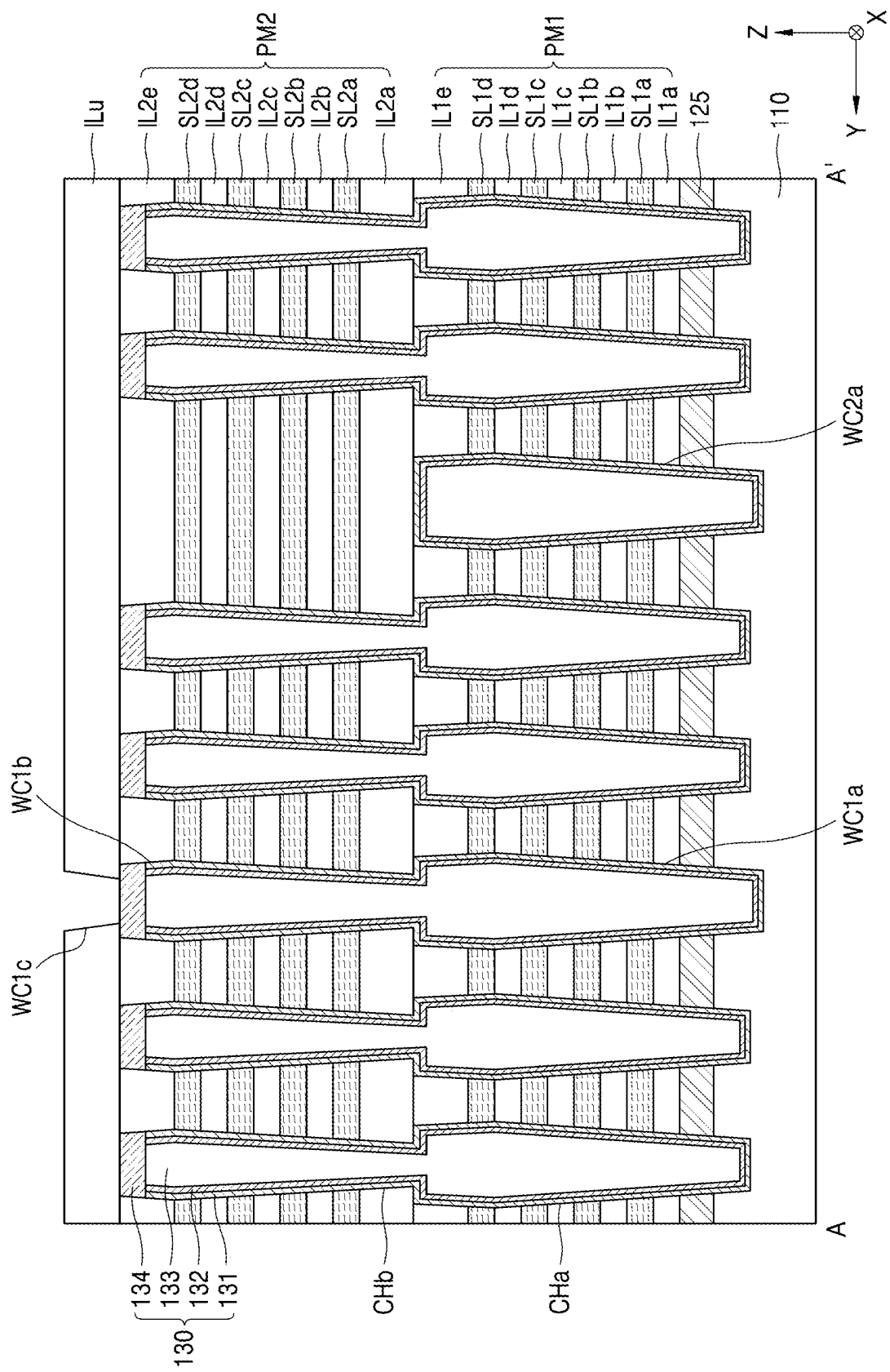

Referring to FIG. 10F, the upper insulating layer ILu may be formed on the second preliminary stacked structure PM2. Next, the sixth word line cut WC1c passing through the upper insulating layer ILu may be formed to expose the channel pad 134 in the second word line cut WC1b. Although not shown in the drawings, a seventh word line cut (not shown) passing through the upper insulating layer ILu to expose the channel pad 134 in the fourth word line cut WC2b (see FIG. 2) and an eighth word line cut (not shown) passing through the upper insulating layer ILu to expose the channel pad 134 in the fifth word line cut WC2c may be further formed.

Figure 10G:
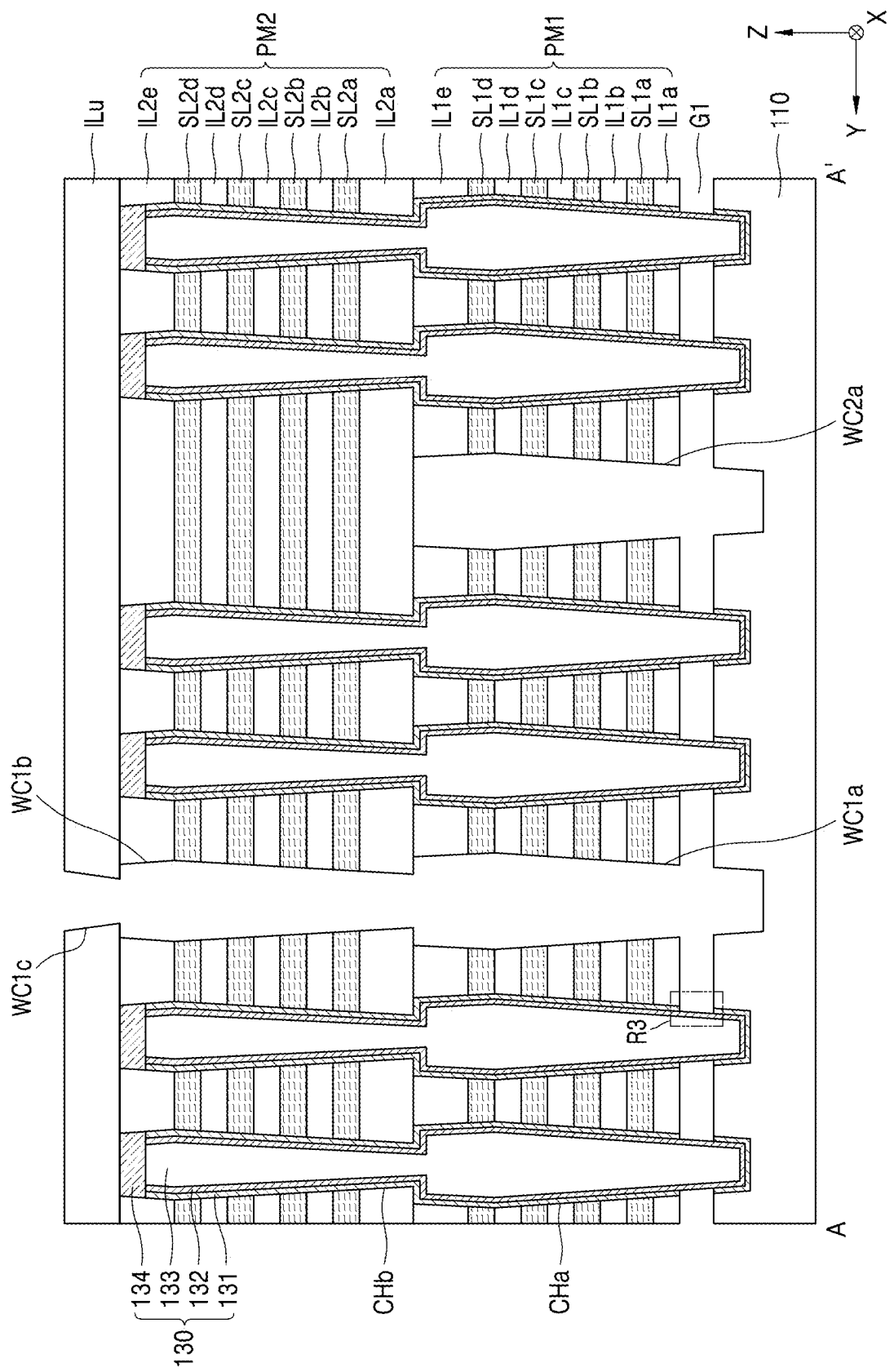
Figure 10H:
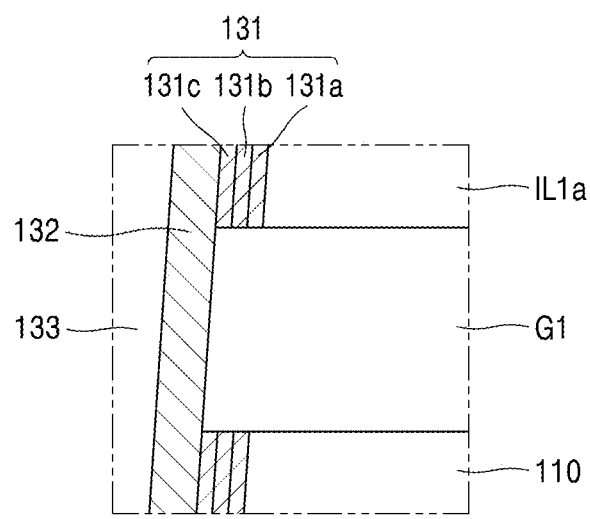
FIG. 10H is an enlarged cross-sectional view of area R3 of FIG. 10G.

Referring to FIGS. 10F and 10G, the gate insulating layer 131, the channel layer 132, the filling insulating layer 133, and the channel pad 134 in the first word line cut WC1a and the second word line cut WC1b may be removed. For example, the sixth word line cut WC1c may form a path for etching the gate insulating layer 131, the channel layer 132, the filling insulating layer 133, and the channel pad 134 in the first word line cut WC1a and the second word line cut WC1b. Further, the gate insulating layer 131, the channel layer 132, the filling insulating layer 133, and the channel pad 134 in the third word line cut WC2a, the fourth word line cut WC2b (see FIG. 2), and the fifth word line cut WC2c may be removed. The seventh word line cut (not shown) and the eighth word line cut (not shown) may form a path for etching the gate insulating layer 131, the channel layer 132, the filling insulating layer 133, and the channel pad 134 in the third word line cut WC2a, the fourth word line cut WC2b (see FIG. 2), and the fifth word line cut WC2c.

Next, the lower sacrificial layer 125 may be removed. The sixth word line cut WC1c, the second word line cut WC1b, and the first word line cut WC1a may form a path for selectively etching the lower sacrificial layer 125. Further, the third word line cut WC2a, the fourth word line cut WC2b (see FIG. 2), the fifth word line cut WC2c (see FIG. 2), the seventh word line cut, and the eighth word line cut may form a path for selectively etching the lower conductive layer 125. By removing the lower sacrificial layer 125, a first gap G1 between the substrate 110 and the first preliminary stacked structure PM1 may be formed. The first gap G1 may expose a side surface of the channel structure 130. That is, the first gap G1 may expose the gate insulating layer 131.

Referring to FIGS. 10G and 10H, a portion of the gate insulating layer 131 exposed through the first gap G1 may be removed. The sixth word line cut WC1c, the second word line cut WC1b, the first word line cut WC1a, and the first gap G1 may form a path for selectively etching the gate insulating layer 131. Also, the third word line cut WC2a, the fourth word line cut WC2b (see FIG. 2), the fifth word line cut WC2c (see FIG. 2), the seventh word line cut, the eighth word line cut, and the first gap G1 may form a path for selectively etching the gate insulating layer 131. The first gap G1 may expose the channel layer 132.

Figure 10I:
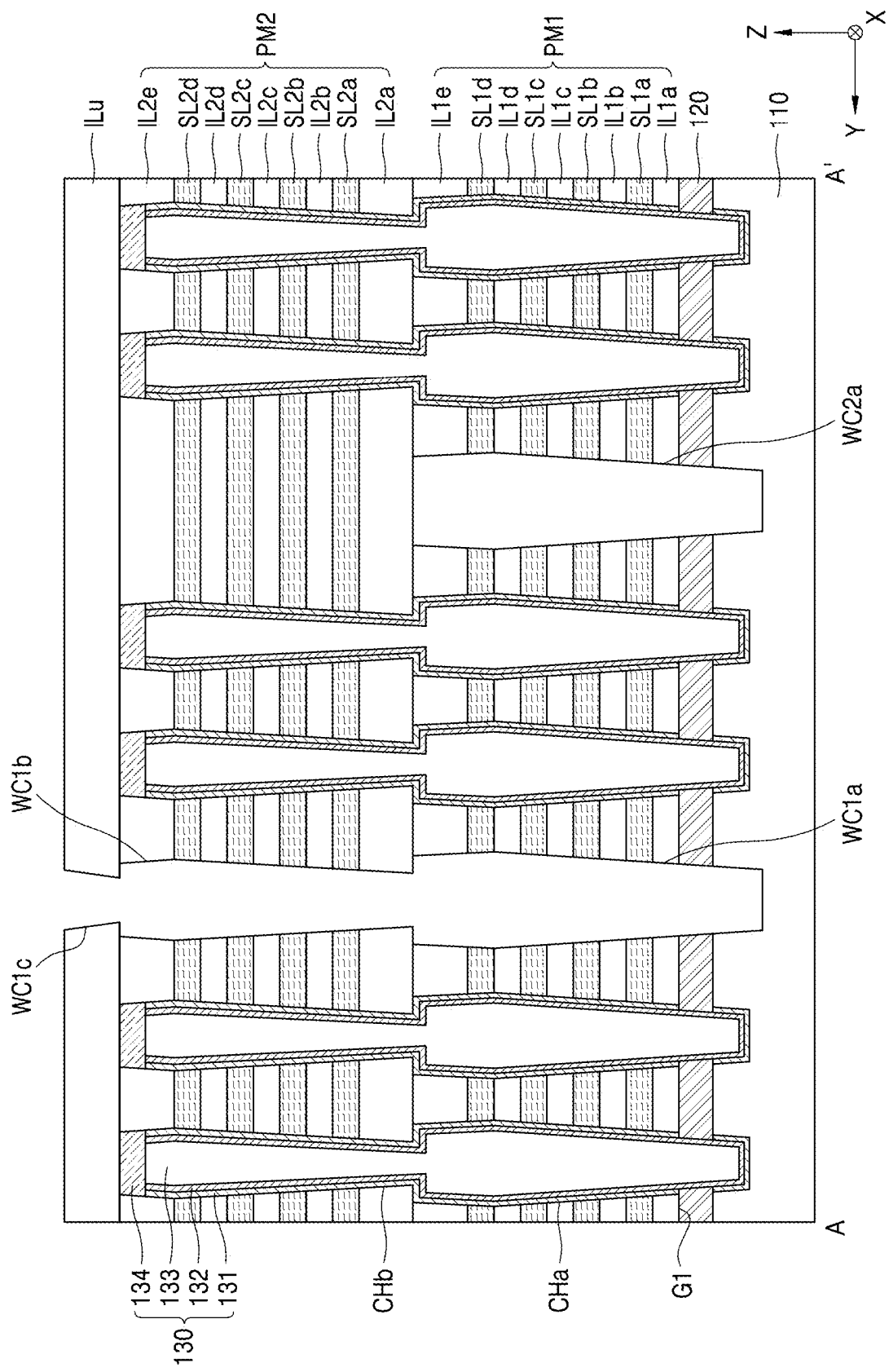

Referring to FIG. 10I, the lower conductive layer 120 may be formed in the first gap G1. The lower conductive layer 120 may be formed between the substrate 110 and the first preliminary stacked structure PM1 to contact the channel layer 132.

Figure 10J:
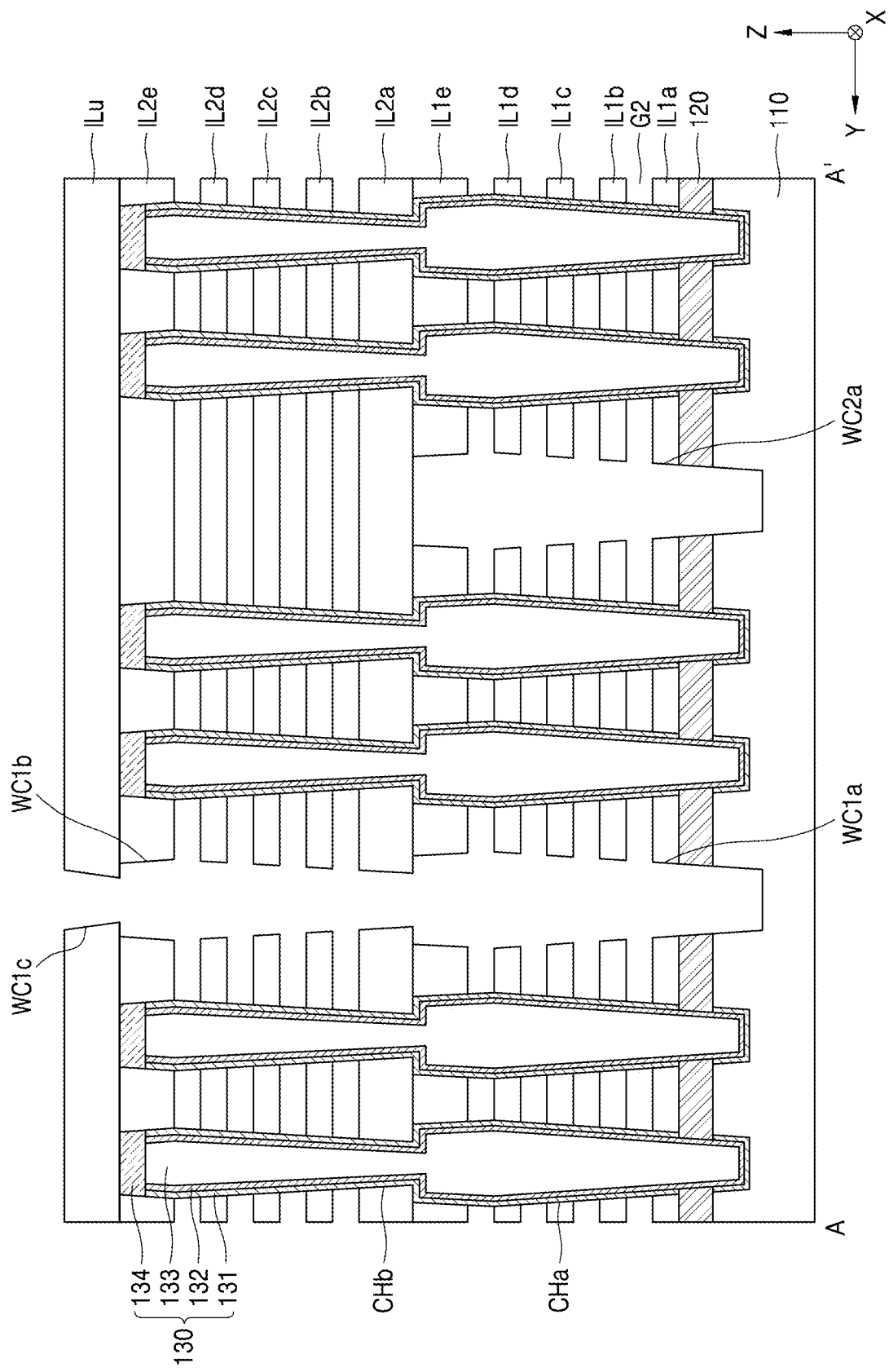

Referring to FIGS. 10I and 10J, the plurality of first sacrificial layers SL1a to SL1d and the plurality of second sacrificial layers SL2a to SL2d may be removed. The sixth word line cut WC1c, the second word line cut WC1b, and the first word line cut WC1a may form a path for selectively etching the plurality of first sacrificial layers SL1a to SL1d and the plurality of second sacrificial layers SL2a to SL2d. In addition, the third word line cut WC2a, the fourth word line cut WC2b (see FIG. 2), the fifth word line cut WC2c (see FIG. 2), the seventh word line cut, and the eighth word line cut may form a path for selectively etching the plurality of first sacrificial layers SL1a to SL1d and the plurality of second sacrificial layers SL2a to SL2d.

A plurality of second gaps G2 may be formed by removing the plurality of first sacrificial layers SL1a to SL1d and the plurality of second sacrificial layers SL2a to SL2d. The plurality of second gaps G2 may be between the plurality of first interlayer insulating layers IL1a to IL1e and between the plurality of second interlayer insulating layers IL2a to IL2e. Each second gap G2 may expose a side surface of the channel structure 130. For example, each second gap G2 may expose the gate insulating layer 131.

Figure 10K:
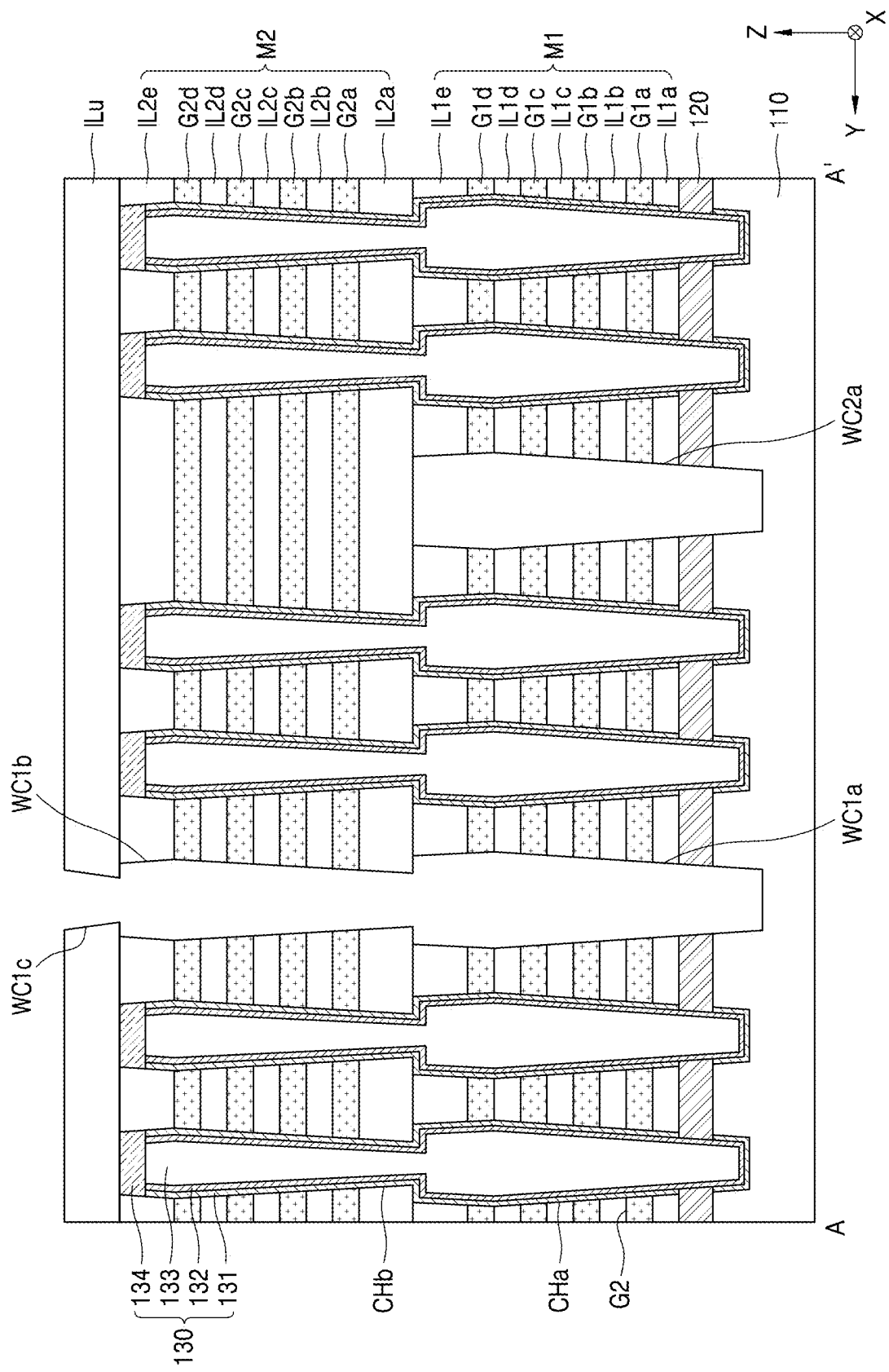

Referring to FIG. 10K, the plurality of first gate layers G1a to G1d and the plurality of second gate layers G2a to G2d may be formed in the plurality of second gaps G2. The plurality of first gate layers G1a to G1d may be formed between the plurality of first interlayer insulating layers IL1a to IL1e. The plurality of second gate layers G2a to G2d may be formed between the plurality of second interlayer insulating layers IL2a to IL2e. The plurality of first gate layers G1a to G1d and the plurality of first interlayer insulating layers IL1a to IL1e may form the first stacked structure M1. The plurality of second gate layers G2a to G2d and the plurality of second interlayer insulating layers IL2a to IL2e may form the second stacked structure M2.

Referring to FIGS. 2 and 3, the first filling structure F1 in the first word line cut WC1a, the second word line cut WC1b, and the sixth word line cut WC1c, and the second filling structure F2 in the third word line cut WC2a, the fourth word line cut WC2b, and the fifth word line cut WC2c may be formed. The nonvolatile memory device 100 may be completely manufactured according to the method described with reference to FIGS. 10A to 10K and FIGS. 2 and 3.

Figure 11:
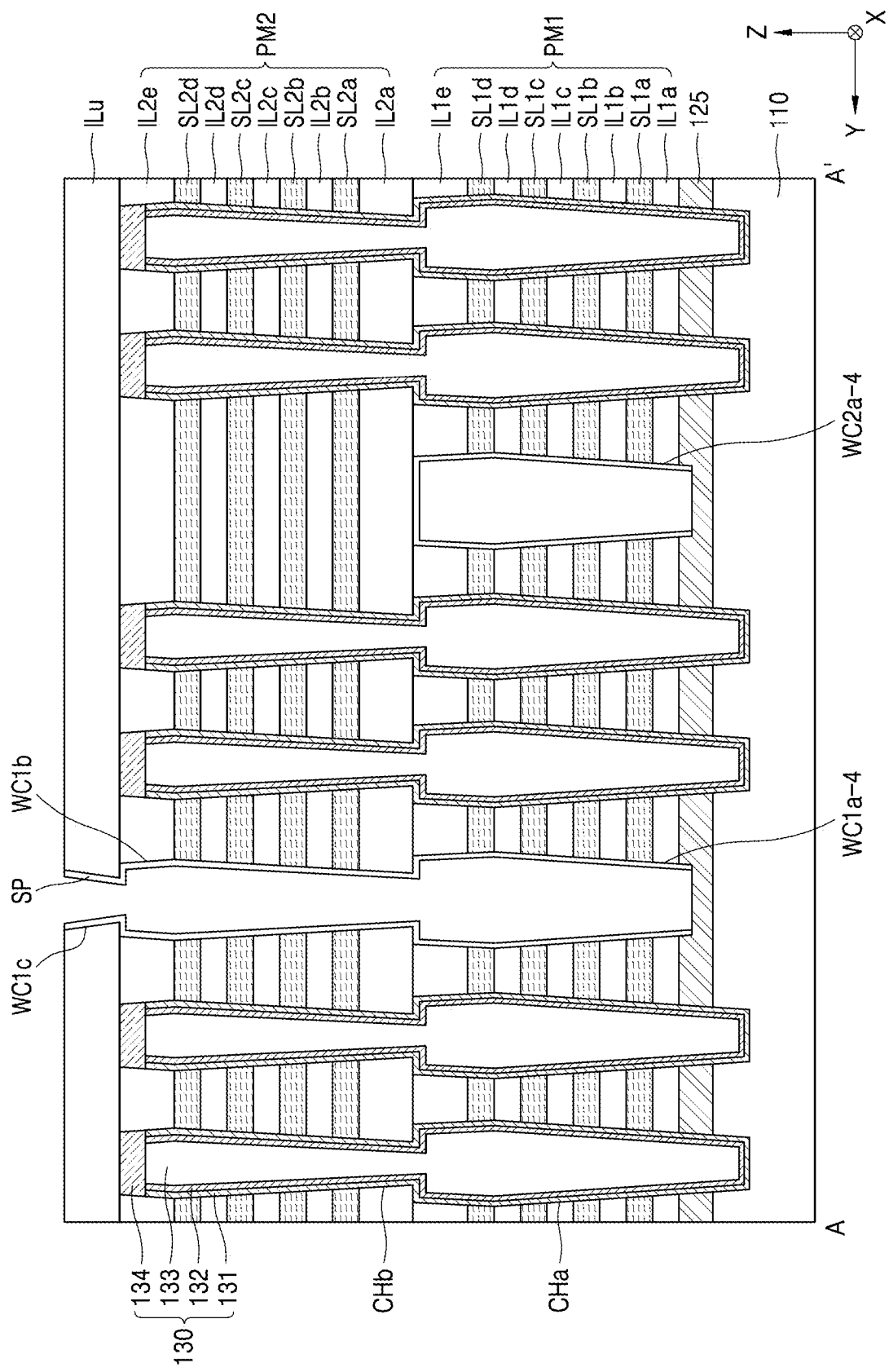
FIG. 11 is a cross-sectional view illustrating a method of manufacturing a nonvolatile memory device, according to embodiments.

FIG. 11 is a cross-sectional view illustrating a method of manufacturing a nonvolatile memory device, according to embodiments. Hereinafter, differences between the manufacturing method described with reference to FIGS. 10A to 10K and the manufacturing method described with reference to FIG. 11 will be described.

Referring to FIG. 11, as described with reference to FIG. 10B, the first channel hole CHa, the first word line cut WC1a-4, and the third word line cut WC2a-4 may be formed. The first word line cut WC1a-4 and the third word line cut WC2a-4 may be formed not to completely pass through the lower sacrificial layer 125, while the first channel hole CHa may be formed to completely pass through the lower sacrificial layer 125. For example, etching conditions may be adjusted so that the etching rate varies according to the shape of a structure to be etched. Lower ends of the first word line cut WC1a-4 and the third word line cut WC2a-4 expose the lower sacrificial layer 125, while the lower end of the first channel hole CHa may expose the substrate 110.

Also, as described with reference to FIG. 10G, before removing the lower conductive layer 125, a spacer layer SP may be formed in the first word line cut WC1a-4, the second word line cut WC1b, the sixth word line cut WC1c, and the third word line cut WC2a-4. Next, portions of the spacer layer SP on lower ends of the first word line cut WC1a-4 and the third word line cut WC2a-4 may be removed so that the lower sacrificial layer 125 is exposed. For example, the spacer layer SP may be anisotropically etched.

Because the spacer layer SP exposes the lower sacrificial layer 125, a path for removing the lower sacrificial layer 125 may be formed. On the other hand, because the plurality of first sacrificial layers SL1a to SL1d and the plurality of second sacrificial layers SL2a to SL2d are covered by the spacer layer SP, the plurality of first sacrificial layers SL1a to SL1d and the plurality of second sacrificial layers SL2a to SL2d may not be etched while the lower sacrificial layer 125 is etched. The nonvolatile memory device 100-4 illustrated in FIG. 8 may be manufactured according to the manufacturing method described with reference to FIG. 11.

Figure 12:
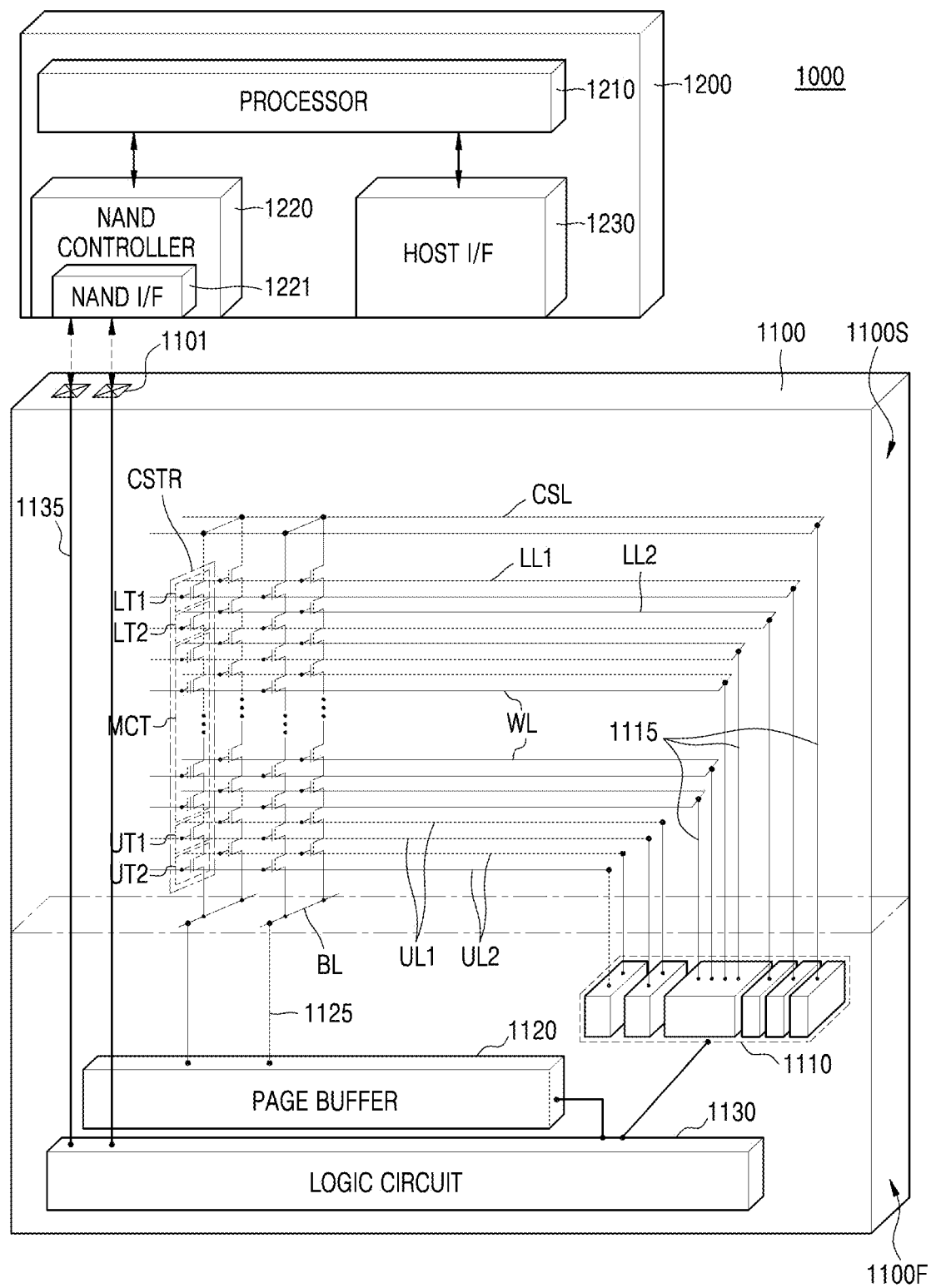
FIG. 12 is a schematic view of an electronic system including a nonvolatile memory device according to embodiments.

FIG. 12 is a schematic view of an electronic system 1000 including a nonvolatile memory device according to embodiments.

Referring to FIG. 12, the electronic system 1000 according to an example embodiment may include a semiconductor device 1100 and a controller 1200 electrically connected to the semiconductor device 1100. The electronic system 1000 may be a storage device including one or more semiconductor devices 1100 or an electronic device including a storage device. For example, the electronic system 1000 may be a solid state drive (SSD) including at least one semiconductor device 1100, a universal serial bus (USB), a computing system, a medical device, or a communication device.

The semiconductor device 1100 may be a nonvolatile memory device. For example, the semiconductor device 1100 may be a NAND flash memory device including one of the nonvolatile memory devices 100, 100-1, 100-2, 100-3, 100-4, and 100-5 described with reference to FIGS. 1 to 9. The semiconductor device 1100 may include a first structure 1100F and a second structure 1100S on the first structure 1100F. In some embodiments, the first structure 1100F may be next to the second structure 1100S. The first structure 1100F may be a peripheral circuit structure including a row decoder circuit 1110, a page buffer 1120, and a logic circuit 1130.

The second structure 1100S may be a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL. The channel structure 130, the plurality of first gate layers G1a to G1d, and the plurality of second gate layers G2a to G2d shown in FIGS. 1 to 8 may form a memory cell string CSTR.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors LT1 and LT2 and the number of upper transistors UT1 and UT2 may vary according to embodiments. The channel structure 130 and one of the first and second gate layers G1a to G1d and G2a to G2d shown in FIGS. 1 to 8 may form one of the plurality of transistors, that is, the lower transistors LT1 and LT2, the upper transistors UT1 and UT2, and the memory cell transistors MCT.

In example embodiments, the upper transistors UT1 and UT2 may include a string selection transistor, and the lower transistors LT1 and LT2 may include a ground selection transistor. The first and second gate lower lines LL1 and LL2 may be gate electrodes of the lower transistors LT1 and LT2, respectively. A word line WL may be a gate electrode of a memory cell transistor MCT, and the first and second gate upper lines UL1 and UL2 may be gate electrodes of the upper transistors UT1 and UT2.

The common source line CSL, the plurality of gate lower lines LL1 and LL2, the plurality of word lines WL, and the plurality of gate upper lines UL1 and UL2 may be electrically connected to the row decoder circuit 1110 through a plurality of first connection wiring layers 1115 extending from the first structure 1100F to the second structure 1100S. A plurality of bit lines BL may be electrically connected to the page buffer 1120 through a plurality of second connection wiring layers 1125 extending from the first structure 1100F to the second structure 1100S.

In the first structure 1100F, the decoder circuit 1110 and the page buffer 1120 may perform a control operation on at least one of the plurality of memory cell transistors MCT.

The decoder circuit 1110 and the page buffer 1120 may be controlled by the logic circuit 1130.

The semiconductor device 1100 may communicate with the controller 1200 through an input/output pad 1101 electrically connected to the logic circuit 1130. The input/output pad 1101 may be electrically connected to the logic circuit 1130 through an input/output connection wiring layer 1135 extending from the first structure 1100F to the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control all operations of the electronic system 1000 including the controller 1200. The processor 1210 may operate according to certain firmware, and may access the semiconductor device 1100 by controlling the NAND controller 1220. The NAND controller 1220 may include a NAND interface 1221 for communication with the semiconductor device 1100. A control command for controlling the semiconductor device 1100, data to be written to the plurality of memory cell transistors MCT of the semiconductor device 1100, data to be read from the plurality of memory cell transistors MCT of the semiconductor device 1100, or the like may be transmitted through the NAND interface 1221. The host interface 1230 may provide a communication function between the electronic system 1000 and an external host. When a control command is received from the external host through the host interface 1230, the processor 1210 may control the semiconductor device 1100 in response to the control command.

Figure 13:
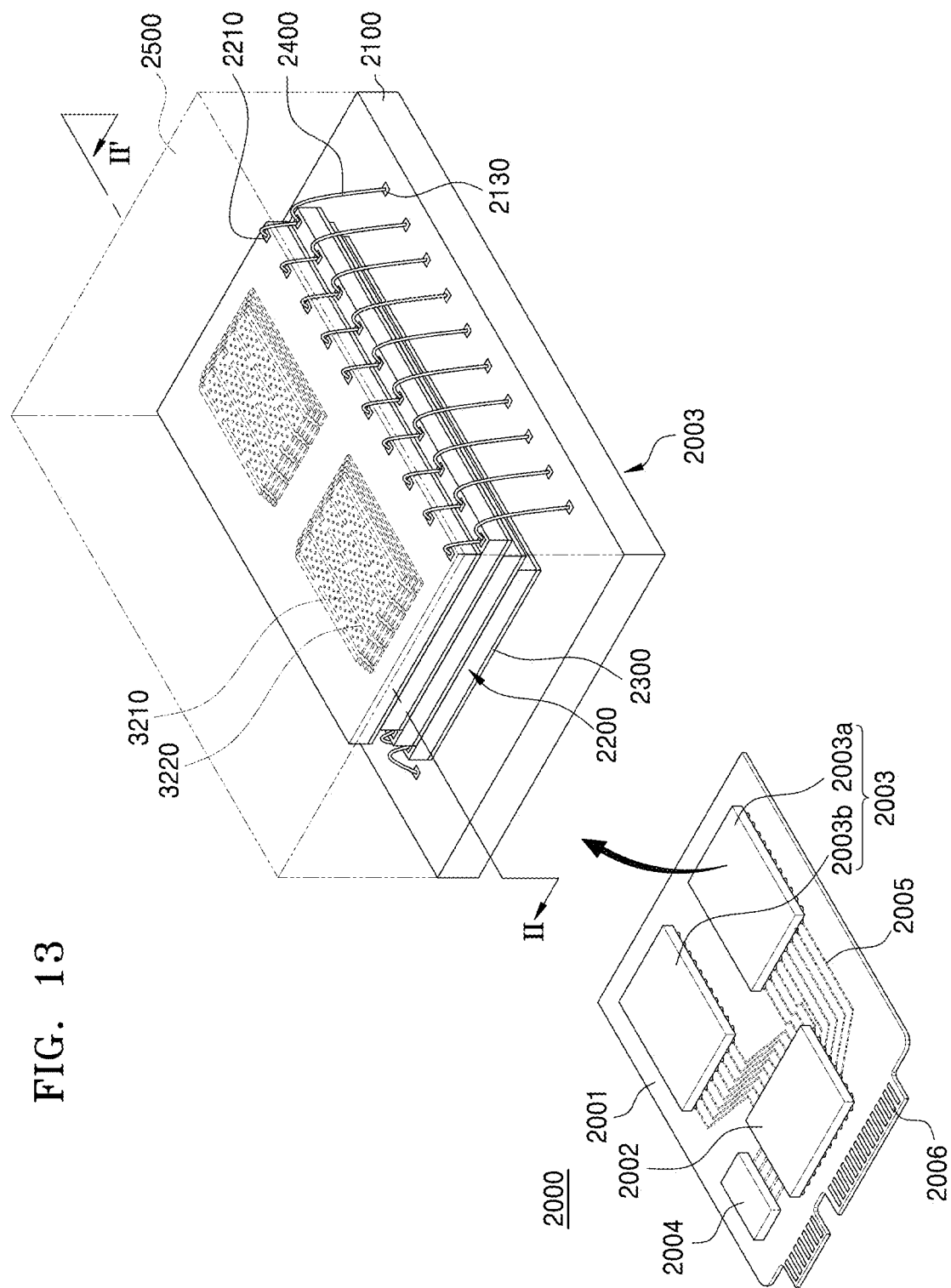
FIG. 13 is a perspective view of an electronic system including a nonvolatile memory device according to embodiments.

FIG. 13 is a perspective view of an electronic system 2000 including a nonvolatile memory device according to embodiments.

Referring to FIG. 13, the electronic system 2000 according to an example embodiment may include a main substrate 2001, a controller 2002 mounted on the main substrate 2001, one or more semiconductor packages 2003, and a DRAM 2004. A semiconductor package 2003 and the DRAM 2004 may be connected to the controller 2002 by a plurality of wiring patterns 2005 formed on the main substrate 2001.

The main substrate 2001 may include a connector 2006 including a plurality of pins coupled to an external host. The number and arrangement of the plurality of pins in the connector 2006 may vary according to a communication interface between the electronic system 2000 and the external host. In example embodiments, the electronic system 2000 may communicate with the external host according to any one of interfaces such as a universal serial bus (USB), peripheral component interconnect express (PCI-Express), serial advanced technology attachment (SATA), M-Phy for universal flash storage (UFS), and the like. In example embodiments, the electronic system 2000 may operate by power supplied from an external host through the connector 2006. The electronic system 2000 may further include a power management integrated circuit (PMIC) that distributes power supplied from the external host to the controller 2002 and the semiconductor package 2003.

The controller 2002 may write data to the semiconductor package 2003 or read data from the semiconductor package 2003, and may improve the operation speed of the electronic system 2000.

The DRAM 2004 may be a buffer memory for reducing a speed difference between the semiconductor package 2003, which is a data storage space, and an external host.

The DRAM 2004 included in the electronic system 2000 may also operate as a type of cache memory, and may provide a space for temporarily storing data in a control operation for the semiconductor package 2003. When the DRAM 2004 is included in the electronic system 2000, the controller 2002 may further include a DRAM controller for controlling the DRAM 2004 in addition to a NAND controller for controlling the semiconductor package 2003.

The semiconductor package 2003 may include first and second semiconductor packages 2003a and 2003b apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 to the package substrate 2100, and a molding layer 2500 covering the plurality of semiconductor chips 2200 and the connection structure 2400 on the package substrate 2100.

The package substrate 2100 may be a printed circuit board including a plurality of package upper pads 2130. Each of the plurality of semiconductor chips 2200 may include an input/output pad 2210. The input/output pad 2210 may correspond to the input/output pad 1101 of FIG. 12. Each of the plurality of semiconductor chips 2200 may include a plurality of stacked structures 3210 and a plurality of channel structures 3220. Each of the plurality of semiconductor chips 2200 may include at least one of the nonvolatile memory devices 100, 100-1, 100-2, 100-3, 100-4, and 100-5 described with reference to FIGS. 1 to 9.

In example embodiments, the connection structure 2400 may be a bonding wire electrically connecting the input/output pad 2210 to a package upper pad 2130. Thus, in the first and second semiconductor packages 2003a and 2003b, the plurality of semiconductor chips 2200 may be electrically connected to each other through a bonding wire method, and may be electrically connected to the package upper pad 2130 of the package substrate 2100. In example embodiments, in the first and second semiconductor packages 2003a and 2003b, the plurality of semiconductor chips 2200 may be electrically connected to each other by a connection structure including a through silicon via (TSV) instead of the connection structure 2400 according to a bonding wire method.

In example embodiments, the controller 2002 and the plurality of semiconductor chips 2200 may be included in one package. In an example embodiment, the controller 2002 and the plurality of semiconductor chips 2200 may be mounted on a separate interposer substrate different from the main substrate 2001, and the controller 2002 and the plurality of semiconductor chips 2200 may be connected to each other by wires formed on the interposer substrate.

Figure 14:
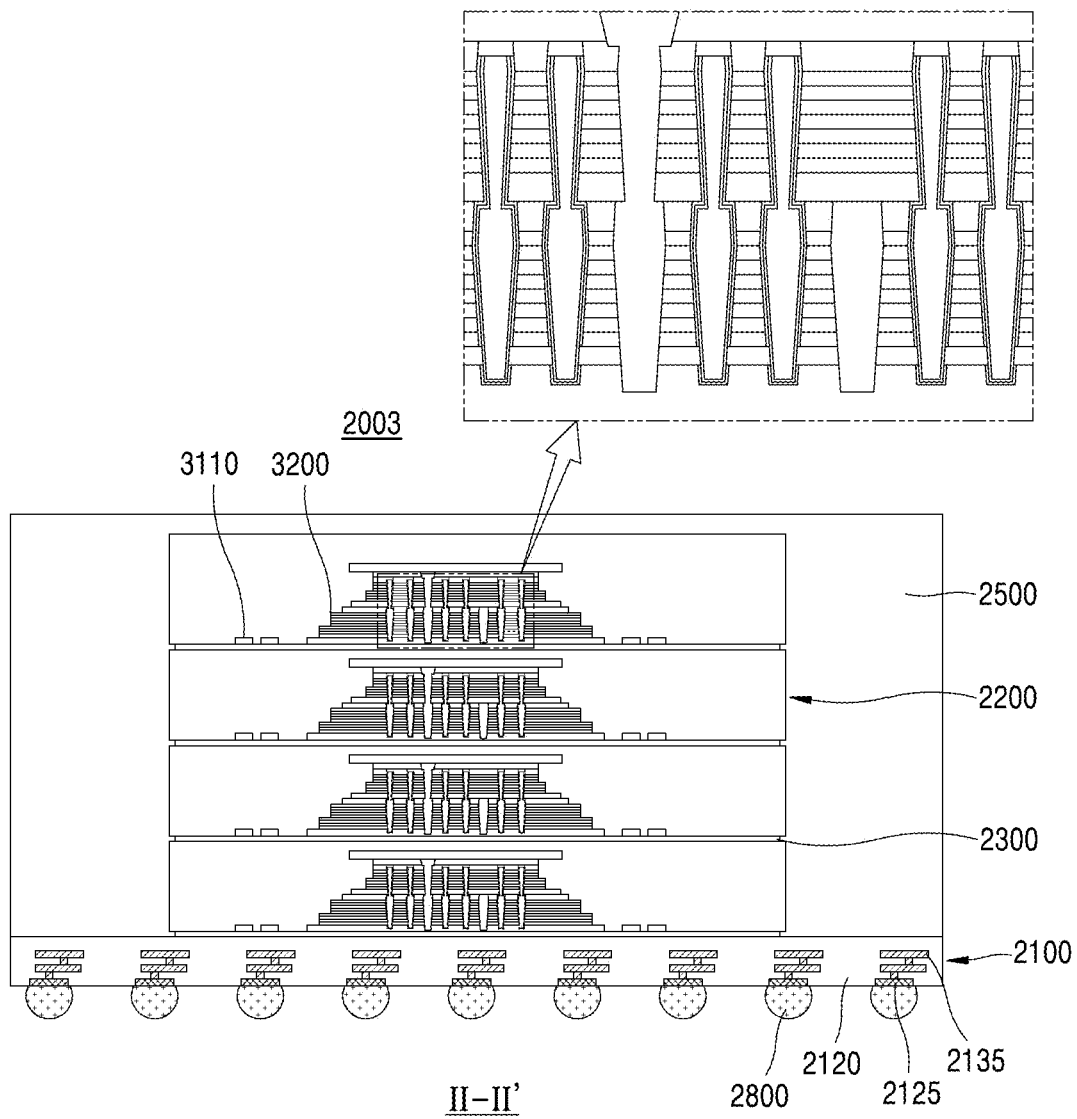
FIG. 14 is a cross-sectional view of semiconductor packages according to embodiments.

FIG. 14 is a cross-sectional view of semiconductor packages according to embodiments. FIG. 14 schematically illustrates a configuration along the line II-IT of FIG. 13.

Referring to FIG. 14, in the semiconductor package 2003, the package substrate 2100 may be a printed circuit board. The package substrate 2100 may include a package substrate body portion 2120, the plurality of package upper pads 2130 (see FIG. 13) on an upper surface of the package substrate body portion 2120, a plurality of lower pads 2125 arranged on a lower surface of the package substrate body portion 2120 or exposed through the lower surface, and a plurality of internal wires 2135 electrically connecting the plurality of package upper pads 2130 (see FIG. 13) to the plurality of lower pads 2125 in the package substrate body portion 2120. As illustrated in FIG. 13, the plurality of package upper pads 2130 may be electrically connected to the plurality of connection structures 2400. As illustrated in FIG. 14, the plurality of lower pads 2125 may be connected to the plurality of wiring patterns 2005 on the main substrate 2001 of the electronic system 2000 shown in FIG. 13 through a plurality of conductive bumps 2800.

Each of the plurality of semiconductor chips 2200 may include a memory cell array 3200 and a peripheral circuit 3110. The plurality of semiconductor chips 2200 may include the nonvolatile memory devices 100, 100-1, 100-2, 100-3, 100-4, and 100-5 described with reference to FIGS. 1 to 9.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some embodiments of inventive concepts have been particularly shown and described, it will be understood that various changes in form and details may be made therein without departing from the spirit and scope of the following claims.

What is claimed is:

1. A nonvolatile memory device comprising:
   a substrate;
   a first stacked structure including a plurality of first gate layers and a plurality of first interlayer insulating layers alternately stacked on the substrate;
   a second stacked structure including a plurality of second gate layers and a plurality of second interlayer insulating layers alternately stacked on the first stacked structure;
   a channel structure including a first portion passing through the first stacked structure and a second portion passing through the second stacked structure; and
   a filling structure including a first portion passing through the first stacked structure and extending in a first horizontal direction and a second portion passing through the second stacked structure and extending in the first horizontal direction,
   wherein a diameter of an upper end of the first portion of the channel structure is greater than a diameter of a lower end of the second portion of the channel structure,
   a width of an upper end of the first portion of the filling structure in a second horizontal direction is greater than a width of the lower end of the second portion of the filling structure in the second horizontal direction, and
   the upper end of the first portion of the filling structure is at a same height as the upper end of the first portion of the channel structure,
   wherein the first stacked structure defines a first word line cut passing through the first stacked structure, the second stacked structure defines a second word line cut passing through the second stacked structure, and the filling structure is a single continuous material extending through the first word line cut and the second word line cut,
   wherein a thickness of an uppermost one of the plurality of first interlayer insulating layers is greater than a thickness of an other one of the plurality of first interlayer insulating layers, and
   wherein an upper surface of the uppermost one of the plurality of first interlayer insulating layers is at a same height as the upper end of the first portion of the filling structure.

2. The nonvolatile memory device of claim 1, wherein a thickness of a lowermost one of the plurality of second interlayer insulating layers is greater than a thickness of an other one of the plurality of second interlayer insulating layers.

3. The nonvolatile memory device of claim 1, further comprising:
   an upper insulating layer on the second stacked structure and the channel structure, wherein
   the filling structure further includes a third portion passing through the upper insulating layer, and
   a width of an upper end of the second portion of the filling structure in the second horizontal direction is greater than a width of a lower end of the third portion of the filling structure in the second horizontal direction.

4. The nonvolatile memory device of claim 3, wherein the upper end of the second portion of the filling structure is at a same height as an upper end of the second portion of the channel structure.

5. The nonvolatile memory device of claim 1, further comprising:
   an upper insulating layer on the second stacked structure and the channel structure, wherein
   the filling structure further includes a third portion passing through the upper insulating layer and partially passing through the second stacked structure, and
   a width of an upper end of the second portion of the filling structure in the second horizontal direction is less than a width of a lower end of the third portion of the filling structure in the second horizontal direction.

6. The nonvolatile memory device of claim 5, wherein a height of the upper end of the second portion of the filling structure is lower than a height of an upper end of the second portion of the channel structure.

7. The nonvolatile memory device of claim 1, wherein the filling structure includes an insulating material.

8. The nonvolatile memory device of claim 7, wherein the filling structure further includes a conductive material.

9. The nonvolatile memory device of claim 1, wherein, in a plan view, a length of the filling structure in the first horizontal direction is greater than a width of the filling structure in the second horizontal direction.

10. A nonvolatile memory device comprising:
    a substrate;
    a first stacked structure including a plurality of first gate layers and a plurality of first interlayer insulating layers alternately stacked on the substrate;
    a second stacked structure including a plurality of second gate layers and a plurality of second interlayer insulating layers alternately stacked on the first stacked structure;
    a channel structure including a first portion passing through the first stacked structure and a second portion passing through the second stacked structure; and a filling structure passing through at least a portion of the first stacked structure and the second stacked structure, the filling structure extending in a first horizontal direction, wherein the filling structure includes a first portion, a second portion, and a third portion, the first portion of the filling structure passes through the first stacked structure and extends in the first horizontal direction, the second portion of the filling structure is on the first portion of the filling structure, passes through the second stacked structure, and extends in the first horizontal direction, and the third portion of the filling structure is on the first portion of the filling structure, passes through the second stacked structure, and extends in the first horizontal direction, a first stacked structure including a plurality of first gate layers and a plurality of first interlayer insulating layers alternately stacked on the substrate, the first stacked structure defining a first channel hole and a first word line cut passing through the first stacked structure, the first word line cut extending in a first horizontal direction;

a second stacked structure including a plurality of second gate layers and a plurality of second interlayer insulating layers alternately stacked on the first stacked structure, the second stacked structure defining a second channel hole and a second word line cut passing through the second stacked structure, the second word line cut extending in the first horizontal direction;

a channel structure in the first channel hole and the second channel hole, the channel structure passing through the first stacked structure and the second stacked structure, and the channel structure extending partially into the substrate;

a first filling structure in the first word line cut and the second word line cut, the first filling structure passing through the first stacked structure and the second stacked structure, and the first filling structure extending partially into the substrate, wherein a height of a lower end of the first word line cut is lower than a height of a lower end of the first channel hole, an upper end of the first word line cut is at a same height as an upper end of the first channel hole, the first filling structure is a single continuous material extending through the first word line cut and the second word line cut; and a second filling structure, wherein the first stacked structure includes a third word line cut passing through the first stacked structure and spaced apart from the first word line cut in a second horizontal direction, the third portion of the filling structure is spaced apart from the second portion of the filling structure in the first horizontal direction, an upper end of the first portion of the filling structure is at a same height as an upper end of the first portion of the channel structure.

11. The nonvolatile memory device of claim 10, wherein the first stacked structure includes a first sub-stack and a second sub-stack spaced apart from each other by the first portion of the filling structure, the second stacked structure includes a third sub-stack on the first sub-stack, a fourth sub-stack on the second sub-stack, and a connection stack on the first portion of the first filling structure, and the connection stack of the second stacked structure connects the third sub-stack of the second stacked structure to the fourth sub-stack of the second stacked structure.

12. The nonvolatile memory device of claim 11, wherein the second portion of the filling structure and the third portion of the filling structure are spaced apart from each other by the connection stack of the second stacked structure.

13. The nonvolatile memory device of claim 10, wherein a length of the first portion of the filling structure in the first horizontal direction is greater than a length of the second portion of the filling structure in the first horizontal direction.

14. A nonvolatile memory device comprising:
a substrate;
the second stacked structure includes a fourth word line cut and a fifth word line cut,
the fourth word line cut passes through the second stacked structure and is connected to the third word line cut,
the fifth word line cut passes through the second stacked structure and is spaced apart from the fourth word line cut in the first horizontal direction, and
the second filling structure is in the third word line cut, the fourth word line cut, and fifth word line cut.

15. The nonvolatile memory device of claim 14, wherein the channel structure includes a gate insulating layer and a channel layer on the gate insulating layer in the first channel hole and the second channel hole.

16. The nonvolatile memory device of claim 15, further comprising:
a lower conductive layer between the substrate and the first stacked structure,
wherein the lower conductive layer passes through the gate insulating layer and contacts the channel layer.

17. The nonvolatile memory device of claim 16, wherein the gate insulating layer covers a bottom of the first channel hole.

18. The nonvolatile memory device of claim 14, wherein lengths of the fourth word line cut and the fifth word line cut in the first horizontal direction are less than a length of third word line cut in the first horizontal direction.

* * * * *